(12) United States Patent
Kagawa et al.

(10) Patent No.: US 10,381,233 B2
(45) Date of Patent: Aug. 13, 2019

(54) METHOD AND APPARATUS FOR SUBSTRATE PROCESSING

(71) Applicant: TOKYO ELECTRON LIMITED, Minato-ku, Tokyo (JP)

(72) Inventors: Koji Kagawa, Kumamoto (JP); Syuhei Yonezawa, Yamanashi (JP); Kazuya Dobashi, Yamanashi (JP); Toshihide Takashima, Tokyo (JP); Masaru Amai, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/851,871

(22) Filed: Dec. 22, 2017

(65) Prior Publication Data

US 2018/0182638 A1     Jun. 28, 2018

(30) Foreign Application Priority Data

Dec. 26, 2016  (JP) ................. 2016-251576
Apr. 10, 2017  (JP) ................. 2017-077832
Aug. 7, 2017   (JP) ................. 2017-152499

(51) Int. Cl.
*H01L 21/02*     (2006.01)
*H01L 21/308*    (2006.01)
*H01L 21/67*     (2006.01)
*H01L 21/311*    (2006.01)
*H01L 21/3213*   (2006.01)

(52) U.S. Cl.
CPC ...... *H01L 21/3085* (2013.01); *H01L 21/0209* (2013.01); *H01L 21/02057* (2013.01); *H01L 21/02087* (2013.01); *H01L 21/31144* (2013.01); *H01L 21/32134* (2013.01); *H01L 21/67023* (2013.01)

(58) Field of Classification Search
None
See application file for complete search history.

(56) References Cited

U.S. PATENT DOCUMENTS

| 2009/0263972 A1* | 10/2009 | Balseanu | H01L 21/3086 438/696 |
| 2012/0244712 A1* | 9/2012 | Tsubata | H01L 21/0332 438/703 |
| 2012/0285481 A1* | 11/2012 | Lee | C23C 16/0245 134/1.1 |
| 2014/0318584 A1* | 10/2014 | Cooper | H01L 21/02057 134/42 |
| 2015/0104947 A1* | 4/2015 | Kim | H01L 21/31111 438/703 |
| 2016/0293441 A1* | 10/2016 | Lee | C23C 16/50 |
| 2018/0174838 A1* | 6/2018 | Ueda | C23C 16/5096 |

FOREIGN PATENT DOCUMENTS

JP    2000-133710    5/2000

* cited by examiner

*Primary Examiner* — Shamim Ahmed
(74) *Attorney, Agent, or Firm* — Amin, Turocy & Watson LLP

(57) ABSTRACT

A substrate processing method according to exemplary embodiments includes bringing removal solution obtained by mixing a nitric acid, a strong acid stronger than the nitric acid, and water into contact with a substrate in which a boron monofilm is formed on a film including a silicon-based film so as to remove the boron monofilm from the substrate.

11 Claims, 22 Drawing Sheets

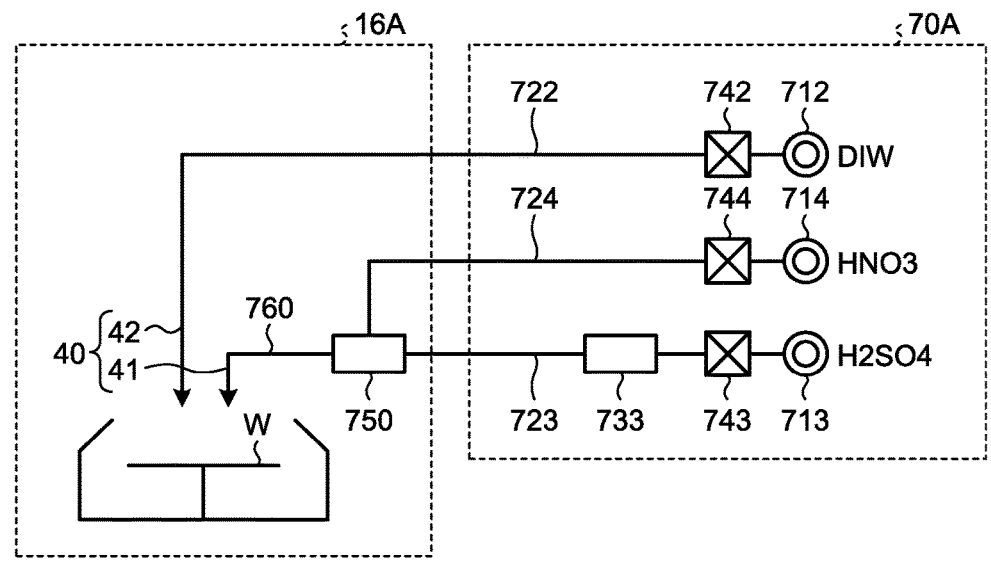
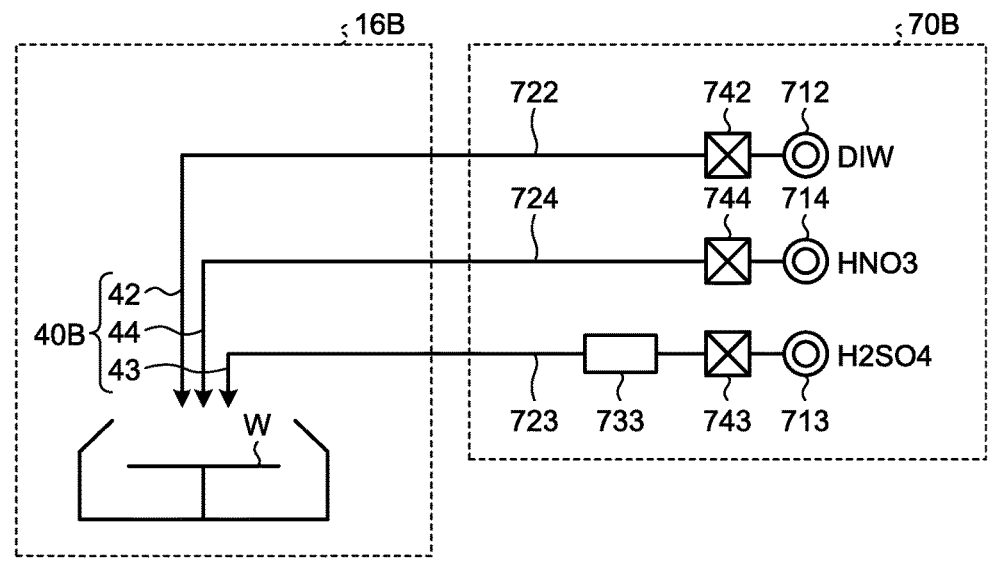

METHOD AND APPARATUS FOR SUBSTRATE PROCESSING

CROSS-REFERENCE TO RELATED APPLICATIONS

The present application claims priority to and incorporates by reference the entire contents of Japanese Patent Application No. 2016-251576 filed in Japan on Dec. 26, 2016, Japanese Patent Application No. 2017-077832 filed in Japan on Apr. 10, 2017 and Japanese Patent Application No. 2017-152499 filed in Japan on Aug. 7, 2017.

FIELD

Exemplary embodiments disclosed herein relate to a substrate processing method, a substrate processing apparatus, a substrate processing system, a control device of the substrate processing system, a method for manufacturing a semiconductor substrate, and the semiconductor substrate.

BACKGROUND

Conventionally, a carbon film etc. is used as a hard mask that is used in an etching process for a semiconductor substrate (see, e.g., Japanese Laid-open Patent Publication No. 2000-133710).

Recently, a boron-based film is attracting attention as a new hard mask material.

Among boron-based films, a boron monofilm has a higher selection ratio than that of a conventional hard mask. However, useful information on a technology for removing the formed boron monofilm from a substrate is not obtained.

SUMMARY

It is an object of the present invention to at least partially solve the problems in the conventional technology.

A substrate processing method according to an aspect of an embodiment includes bringing removal solution obtained by mixing a nitric acid, a strong acid stronger than the nitric acid, and water into contact with a substrate in which a boron monofilm is formed on a film including a silicon-based film so as to remove the boron monofilm from the substrate.

BRIEF DESCRIPTION OF DRAWINGS

A more complete appreciation of the present application and many of the attendant advantages thereof will be readily obtained as the same becomes better understood by reference to the following detailed description when considered in connection with the accompanying drawings, wherein:

FIG. 9 is a diagram illustrating a configuration example of a processing liquid supply system in a processing unit according to a second embodiment;

FIG. 10 is a diagram illustrating a configuration example of a processing liquid supply system in a processing unit according to a third embodiment;

DESCRIPTION OF EMBODIMENTS

Hereinafter, exemplary embodiments of a substrate processing method, a substrate processing apparatus, a substrate processing system, a control device of the substrate processing system, a method for manufacturing a semiconductor substrate, and the semiconductor substrate disclosed in the present application will be described in detail with reference to the accompanying drawings. In addition, the illustrative embodiments disclosed below are not intended to limit the present invention.

First Embodiment

Substrate Processing Method

First, an example of a substrate processing method according to the first embodiment will be described with reference to FIGS. 1A to 1D. FIGS. 1A to 1D are diagrams illustrating an example of a substrate processing method according to the first embodiment.

The substrate processing method according to the present embodiment is intended for a semiconductor substrate (hereinafter, referred to as simply "wafer") such as a silicon wafer that has films including a silicon-based film.

Herein, in order to make the comprehension of the present embodiment easy, a case where the substrate processing method is intended for a wafer having only a silicon oxide film as a silicon-based film will be described below. However, the wafer may have a film other than a silicon oxide film. Moreover, a silicon-based film may be a SiN film, a polysilicon film, or the like.

Figure 1A:
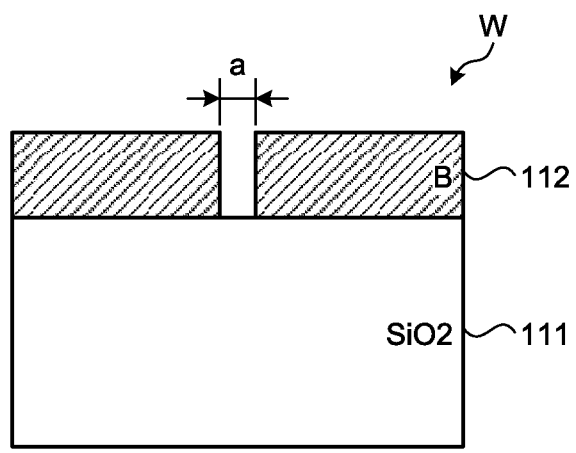
FIGS. 1A to 1D are diagrams illustrating an example of a substrate processing method according to a first embodiment.

As illustrated in FIG. 1A, in the substrate processing method according to the first embodiment, a boron monofilm 112 is first formed on a silicon oxide film 111 of a wafer W (film forming process).

The boron monofilm 112 is a film consisting of only boron (B). However, the boron monofilm 112 may contain inevitable impurities to be inevitably mixed in the film forming process within the limit to be inevitably mixed. The inevitable impurities include, e.g., hydrogen (H), oxygen (O), or carbon (C).

Figure 1B:
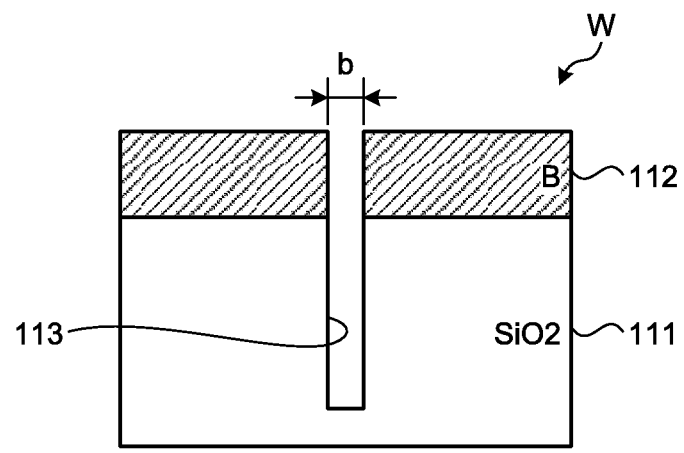

Next, as illustrated in FIG. 1B, in the substrate processing method according to the first embodiment, the wafer W after the film forming process is etched (etching process).

Specifically, in the etching process, a concave portion (trench) 113 not less than, e.g., 500 nm is formed in the depth direction of the silicon oxide film 111 by using the boron monofilm 112 formed in the film forming process as a hard mask.

Because the boron monofilm 112 is hard to be etched under the etching condition of the silicon oxide film 111, the silicon oxide film 111 can be etched at a higher rate than that of the boron monofilm 112. In other words, the selection rate between the silicon oxide film 111 and the boron monofilm 112 is high. Therefore, even if the depth of the concave portion 113 is not less than 500 nm, the excessive spread of an opening width "b" of the concave portion 113 can be suppressed compared with an opening width "a" of the boron monofilm 112.

Figure 1C:
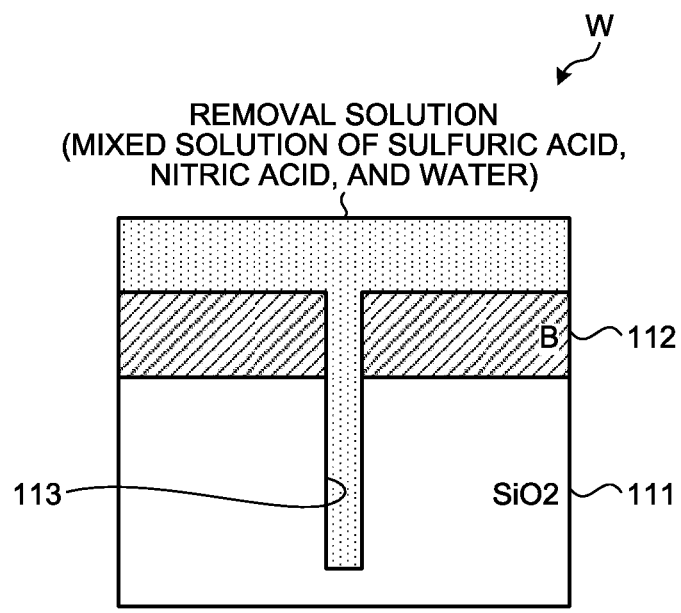

Next, as illustrated in FIG. 1C, in the substrate processing method according to the first embodiment, the boron monofilm 112 is removed from the wafer W after the etching process.

Specifically, after holding the etching-processed wafer W (holding process), the boron monofilm 112 is removed from the wafer W by bringing removal solution into contact with the held wafer W (removing process).

Herein, removal solution is mixed solution of a nitric acid (HNO3), a strong acid stronger than the nitric acid, and water (H2O). An example in which a sulfuric acid (H2SO4) is used as a strong acid will be described in the present embodiment. On the other hand, a carborane acid, a trifluoromethane sulfonic acid, etc. may be used as a strong acid. In other words, according to the definition of Broensted, it is sufficient that a strong acid is an acid that can give a proton (H+) to the nitric acid. Water is, e.g., DIW (deionized water). Moreover, an organic acid (formic acid (HCOOH) that is carboxylic acid), an oxalic acid ((COOH)2), an acetic acid (CH3COOH), a propionic acid (CH3CH2COOH), a butyric acid (CH3(CH2)2COOH), a valeric acid (CH3(CH2)3COOH), etc. may be used instead of and mixed with water.

Figure 1D:
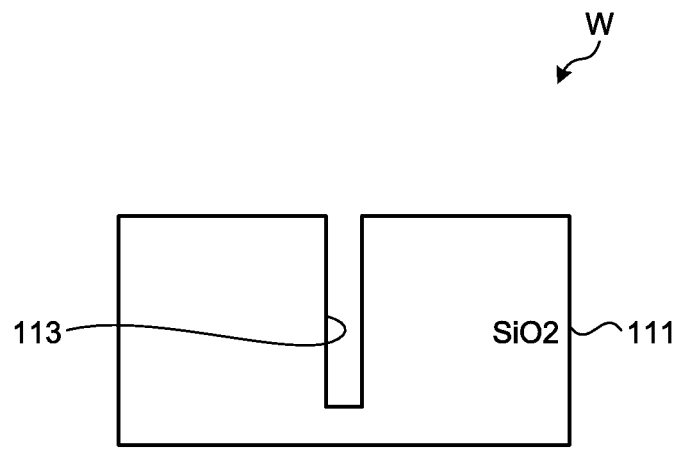

When using the removal solution, a nitric acid functions as a base to generate a nitronium ion dehydrated by a strong acid and the nitronium ion reacts with the boron monofilm 112 to exfoliate the monofilm from the wafer W. As a result, as illustrated in FIG. 1D, the boron monofilm 112 can be removed from the wafer W.

As described above, according to the substrate processing method according to the first embodiment, the boron monofilm 112 formed on the silicon oxide film 111 can be appropriately removed from the wafer W.

In this case, if the concentration of a sulfuric acid in removal solution is not more than 64 wt % and the concentration of a nitric acid in the removal solution is not less than 3 wt % and not more than 69 wt %, the effect can be obtained. It is more preferable that the concentration of the sulfuric acid is not more than 50 wt % and the concentration of the nitric acid is not less than 3 wt % and not more than 69 wt %.

In order to enhance removal performance of the boron monofilm 112, it is important to generate more etchant. For that purpose, it is preferable to appropriately adjust a ratio of water essential for the generation of a substance (ion) that acts as etchant of boron.

Figure 18:
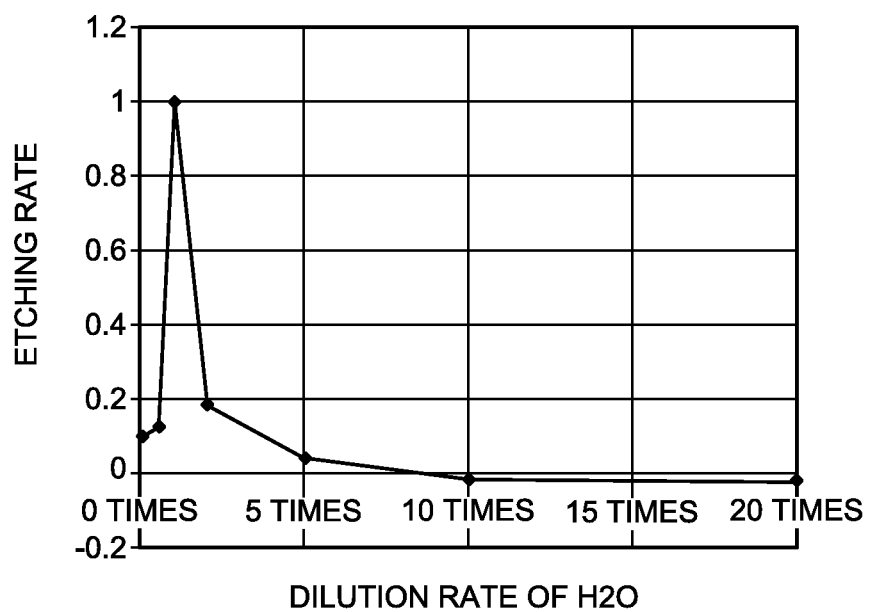
FIG. 18 is a graph illustrating a relationship between a dilution rate of removal solution and an etching rate of a boron monofilm.

Herein, usability of water in removal solution will be described with reference to FIG. 18. FIG. 18 is a graph illustrating a relationship between a dilution rate of removal solution and an etching rate of the boron monofilm 112. The horizontal axis of the graph illustrated in FIG. 18 indicates a dilution rate in a case where removal solution of a sulfuric acid 46 wt % and a nitric acid 3 wt % is diluted with water. Therefore, for example, in the horizontal axis of FIG. 18, "one-time" removal solution indicates removal solution itself of the sulfuric acid 46 wt % and the nitric acid 3 wt %, and "five-time" removal solution indicates solution obtained by diluting the removal solution of the sulfuric acid 46 wt % and the nitric acid 3 wt % with five-time water of the removal solution. Moreover, "zero-time" removal solution indicates mixed solution of a sulfuric acid and a nitric acid without containing water. On the other hand, the vertical axis of the graph of FIG. 18 indicates a relative value of an etching rate in a case where the largest one of the measured etching rates is assumed as one.

The inventors of the present invention have found that the boron monofilm 112 can be removed at an extremely high etching rate, by diluting removal solution at a specified dilution rate, namely, by diluting mixed solution of a sulfuric acid and a nitric acid to be the specified concentration, as compared with a case where a dilution rate is zero times (mixed solution of sulfuric acid and nitric acid without containing water) and a case where a dilution rate is a rate other than the specified dilution rate (mixed solution of sulfuric acid and nitric acid is diluted to be concentration other than the specified concentration), for example. Specifically, as illustrated in FIG. 18, it turns out that an extremely large etching rate is obtained by diluting mixed solution of a sulfuric acid and a nitric acid, which contains the sulfuric acid of 46 wt % and the nitric acid of 3 wt %, with 0.45-time to 1.8-time water of the mixed solution, as compared with a case where the mixed solution is diluted at another dilution rate or a case where the mixed solution is diluted at a zero-time dilution rate. More specifically, the boron monofilm 112 has the highest etching rate when the mixed solution is diluted with 0.9-time water.

Configuration of Substrate Processing System

Figure 2:
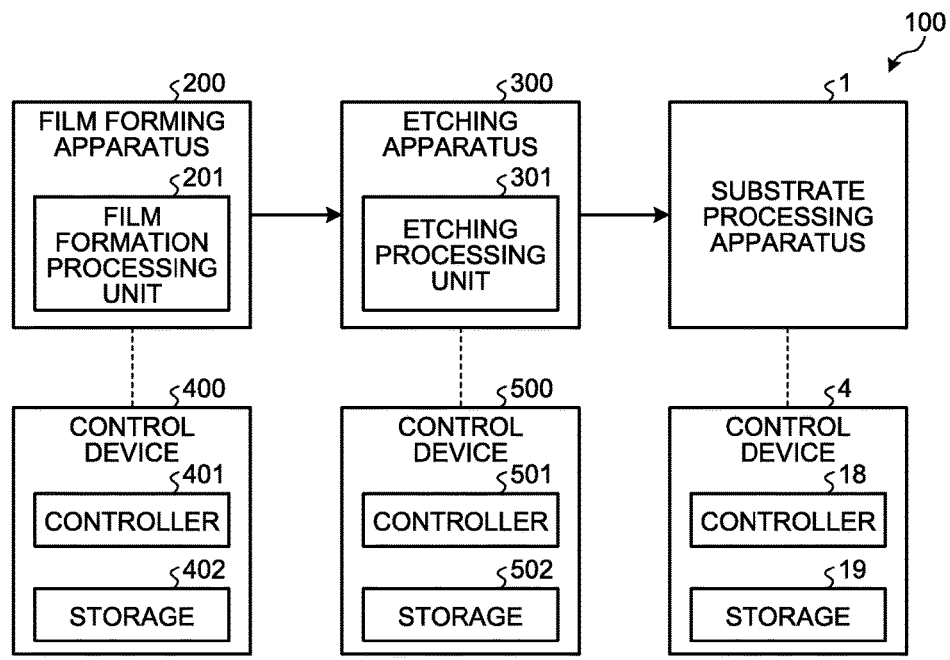
FIG. 2 is a block diagram illustrating an example of a substrate processing system according to the first embodiment.

Next, a configuration example of a substrate processing system 100 according to the present embodiment will be described with reference to FIG. 2. FIG. 2 is a block diagram illustrating a configuration example of the substrate processing system 100 according to the first embodiment.

As illustrated in FIG. 2, the substrate processing system 100 includes a film forming apparatus 200, an etching apparatus 300, and a substrate processing apparatus 1.

The film forming apparatus 200 is an apparatus that performs the film forming process described above. The film forming apparatus 200 includes a film formation processing unit 201. The configuration of the film formation processing unit 201 will be explained below with reference to FIG. 3.

Although it is not illustrated herein, the film forming apparatus 200 includes, for example, a placing section in which the wafer W is placed, a transfer device that transfers the wafer W placed in the placing section to the film formation processing unit 201, etc., in addition to the film formation processing unit 201.

The etching apparatus 300 is an apparatus that performs the etching process described above. The etching apparatus 300 includes an etching processing unit 301. The configuration of the etching processing unit 301 will be described below with reference to FIG. 4.

Although it is not illustrated herein, the etching apparatus 300 includes, for example, a placing section in which the wafer W is placed, a transfer device that transfers the wafer W placed in the placing section to the etching processing unit 301, etc., in addition to the etching processing unit 301.

The substrate processing apparatus 1 is an apparatus that performs the holding process and removing process described above. The configuration of the substrate processing apparatus 1 will be described below with reference to FIGS. 5 and 6.

Control devices 4, 400, and 500 are respectively connected to the substrate processing apparatus 1, the film forming apparatus 200, and the etching apparatus 300. The control devices 4, 400, 500 include respective controllers 18, 401, 501 and respective storages 19, 402, 502.

Each of the controllers 18, 401, and 501 includes a microcomputer and various types of circuits that include a central processing unit (CPU), a read only memory (ROM), a random access memory (RAM), an input-output port, etc., for example. In each of the controllers 18, 401, and 501, the CPU executes a program stored in the ROM by using the RAM as a working area so as to control corresponding operations of the substrate processing apparatus 1, the film forming apparatus 200, and the etching apparatus 300.

The program may be recorded in a computer-readable recording medium and thus may be installed into the storage of the control device from the recording medium. A computer-readable recording medium includes, for example, a hard disk (HD), a flexible disk (FD), a compact disc (CD), a magneto-optical disk (MO), and a memory card.

Each of the storages 19, 402, and 502 is realized by, for example, a semiconductor memory device, such as RAM and a flash memory, or a storage device such as a hard disk and an optical disc.

Configuration of Film Formation Processing Unit

Figure 3:
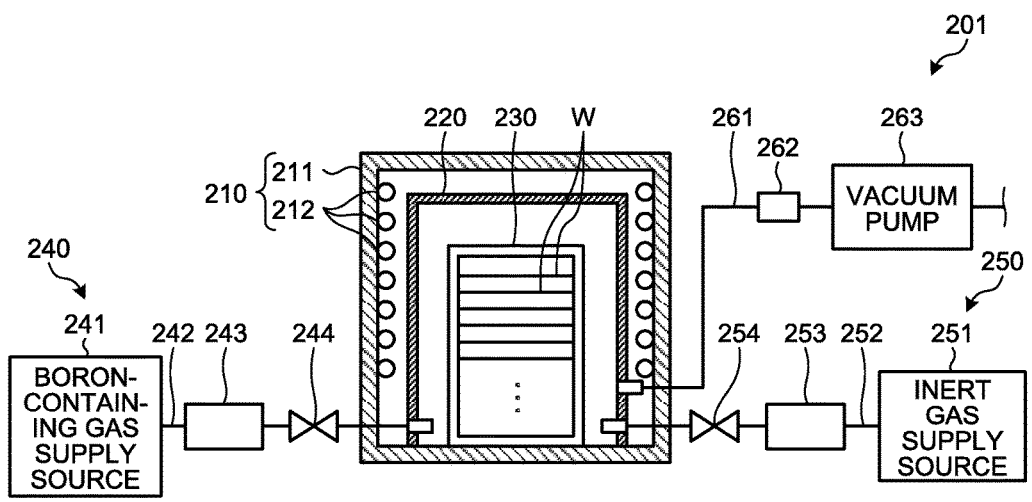
FIG. 3 is a diagram illustrating a configuration example of a film formation processing unit.

Next, a configuration example of the film formation processing unit 201 included in the film forming apparatus 200 will be described with reference to FIG. 3. FIG. 3 is a diagram illustrating a configuration example of the film formation processing unit 201.

As illustrated in FIG. 3, the film formation processing unit 201 is a batch-type processing device that can process a plurality of wafers W at a time, for example, 50 to 150 wafers. The film formation processing unit 201 includes a heating furnace 210 that includes a cylindrical heat-insulating body 211 having a ceiling and a heater 212 provided on an inner circumferential surface of the heat-insulating body 211.

A processing container 220 made of, e.g., quartz is inserted in the heating furnace 210. The heater 212 is provided to surround the outside of the processing container 220.

A wafer boat 230 is arranged inside the processing container 220. The wafer boat 230 is formed of quartz to accommodate, e.g., 50 to 150 wafers accumulated with a predetermined interval pitch. The wafer boat 230 is lifted and lowered by a lifting and lowering mechanism that is not illustrated, and thus can be carried into and out of the processing container 220.

The film formation processing unit 201 includes a boron-containing gas supply mechanism 240 configured to introduce, as boron-containing gas that is film-formation source gas, e.g., B2H6 gas into the processing container 220, and an inert gas supply mechanism 250 configured to introduce inert gas to be used as purge gas etc. into the processing container 220.

The boron-containing gas supply mechanism 240 includes a boron-containing gas supply source 241 configured to supply boron-containing gas, e.g., B2H6 gas as film-formation source gas, and a film-formation gas pipe 242 configured to guide film-formation gas into the processing container 220 from the boron-containing gas supply source 241. A flow controller 243 and an opening/closing valve 244 are provided in the film-formation gas pipe 242.

The inert gas supply mechanism 250 includes an inert gas supply source 251 and an inert gas pipe 252 configured to guide inert gas into the processing container 220 from the inert gas supply source 251. A flow controller 253, such as a massflow controller, and an opening/closing valve 254 are provided in the inert gas pipe 252. Rare gas such as N2 gas and Ar gas can be used as inert gas.

An exhaust pipe 261 is connected to the processing container 220, and a vacuum pump 263 is connected to the exhaust pipe 261 via a pressure regulating mechanism 262 that includes a pressure regulating valve etc. As a result, the inside of the processing container 220 can be adjusted to a predetermined pressure by using the pressure regulating mechanism 262 while exhausting gas in the processing container 220 by using the vacuum pump 263.

Configuration of Etching Processing Unit

Figure 4:
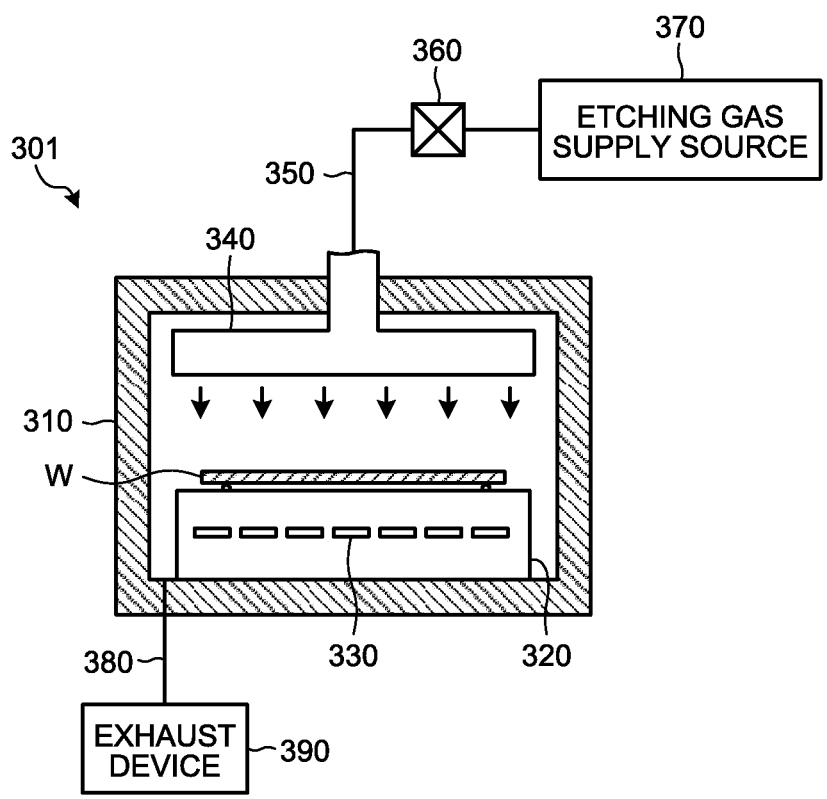
FIG. 4 is a diagram illustrating a configuration example of an etching processing unit.

Next, the configuration of the etching processing unit 301 included in the etching apparatus 300 will be described with reference to FIG. 4. FIG. 4 is a diagram illustrating a configuration example of the etching processing unit 301.

As illustrated in FIG. 4, the etching processing unit 301 includes a sealed-structure chamber 310 configured to accommodate the wafer W. A placing pedestal 320 that horizontally places thereon the wafer W is provided in the chamber 310. The placing pedestal 320 includes a temperature regulating mechanism 330 configured to regulate the temperature of the wafer W to a predetermined temperature by cooling or heating the wafer W. A carry-in/out port (not illustrated) configured to carry the wafer W into and out of the chamber 310 is provided on a side wall of the chamber 310.

A shower head 340 is provided on a ceiling of the chamber 310. A gas supply pipe 350 is connected to the shower head 340. An etching gas supply source 370 is connected to the gas supply pipe 350 via a valve 360. The predetermined etching gas is supplied from the etching gas supply source 370 to the shower head 340. The shower head 340 supplies the etching gas supplied from the etching gas supply source 370 into the chamber 310.

The etching gas supplied from the etching gas supply source 370 is CH3F gas, CH2F2 gas, CF4 gas, O2 gas, Ar gas, for example.

An exhaust device 390 is connected to a bottom of the chamber 310 via an exhaust line 380. The internal pressure of the chamber 310 is maintained by the exhaust device 390 in a pressure-reduced state.

Configuration of Substrate Processing Apparatus

Figure 5:
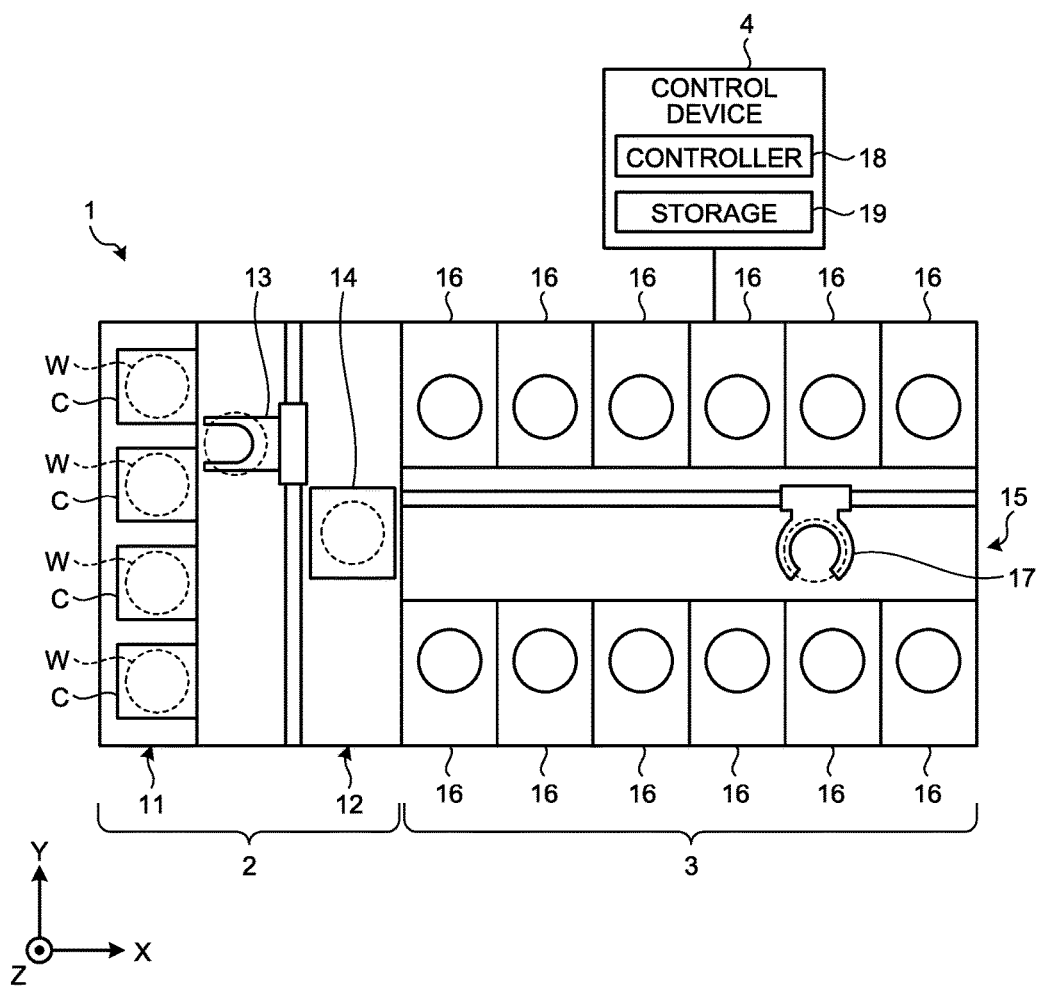
FIG. 5 is a diagram illustrating a schematic configuration of a substrate processing apparatus according to the first embodiment.

Next, a configuration example of the substrate processing apparatus 1 will be described with reference to FIG. 5. FIG. 5 is a diagram illustrating a schematic configuration of the substrate processing apparatus 1 according to the first embodiment. Hereinafter, in order to make a positional relationship clear, X-axis, Y-axis, and Z-axis will be defined to be perpendicular to each other and the positive Z-axis direction is regarded as a vertically upward direction.

As illustrated in FIG. 5, the substrate processing apparatus 1 includes a carry-in/out station 2 and a processing station 3. The carry-in/out station 2 and the processing station 3 are provided adjacent to each other.

The carry-in/out station 2 includes a carrier placing section 11 and a transfer section 12. In the carrier placing section 11, a plurality of carriers C are placed to horizontally accommodate a plurality of substrates, namely, semiconductor wafers (hereinafter, wafer W) in the present embodiment.

The transfer section 12 is provided adjacent to the carrier placing section 11, and includes therein a substrate transfer device 13 and a delivery unit 14. The substrate transfer device 13 includes a wafer holding mechanism configured to hold the wafer W. The substrate transfer device 13 is movable horizontally and vertically and is pivotable around a vertical axis, and transfers the wafer W between the corresponding carrier C and the delivery unit 14 by using the wafer holding mechanism.

The processing station 3 is provided adjacent to the transfer section 12. The processing station 3 includes a transfer section 15 and a plurality of processing units 16. The plurality of processing units 16 are provided side by side at both sides of the transfer section 15.

The transfer section 15 includes therein a substrate transfer device 17. The substrate transfer device 17 includes a wafer holding mechanism configured to hold the wafer W. The substrate transfer device 17 is movable horizontally and vertically and is pivotable around a vertical axis, and transfers the wafer W between the delivery unit 14 and the corresponding processing unit 16 by using the wafer holding mechanism.

Each of the processing units 16 performs a predetermined substrate processing on the wafer W transferred by the substrate transfer device 17.

In the substrate processing apparatus 1 configured as described above, the substrate transfer device 13 of the carry-in/out station 2 first takes out a wafer W from one of the carriers C placed in the carrier placing section 11, and places the taken wafer W on the delivery unit 14. The wafer W placed on the delivery unit 14 is taken out from the delivery unit 14 by the substrate transfer device 17 of the processing station 3, and is carried into one of the processing units 16.

The wafer W carried into the processing unit 16 is processed by the processing unit 16, and then is carried out from the processing unit 16 and placed on the delivery unit 14 by using the substrate transfer device 17. Then, the processed wafer W placed on the delivery unit 14 is returned to the corresponding carrier C in the carrier placing section 11 by using the substrate transfer device 13.

Configuration of Processing Unit

Figure 6:
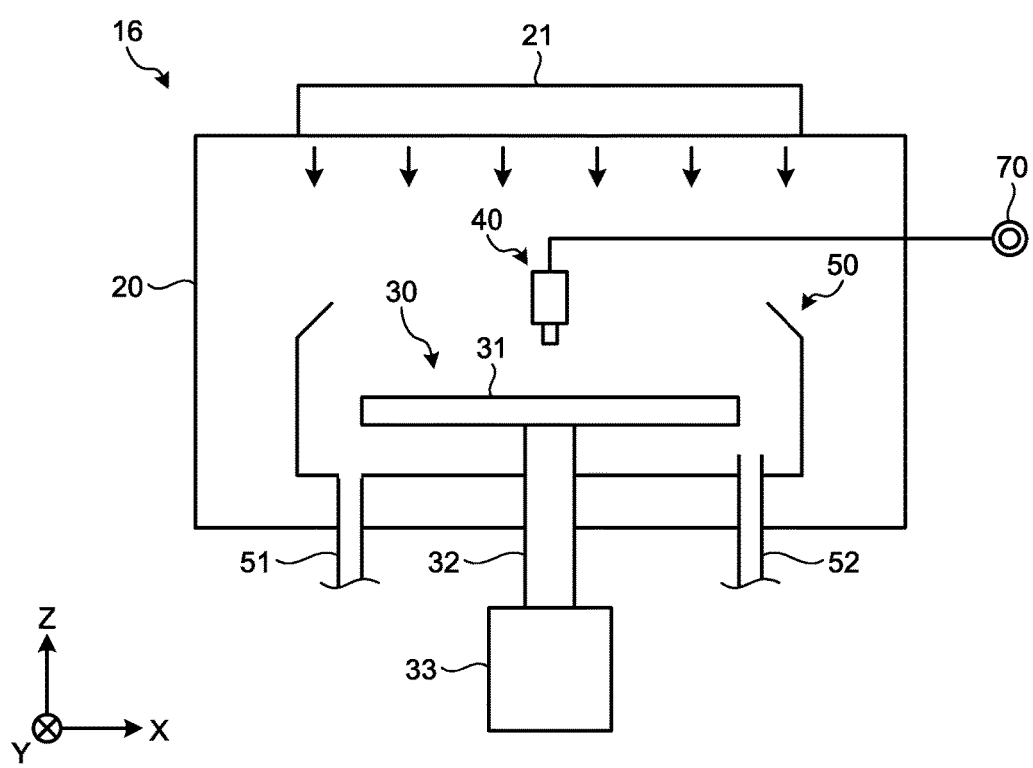
FIG. 6 is a diagram illustrating a schematic configuration of a processing unit according to the first embodiment.

Next, the configuration of the processing unit 16 will be described with reference to FIG. 6. FIG. 6 is a diagram illustrating a schematic configuration of the processing unit 16 according to the first embodiment.

As illustrated in FIG. 6, the processing unit 16 includes a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on a ceiling of the chamber 20. The FFU 21 forms a downflow within the chamber 20.

The substrate holding mechanism 30 includes a holding unit 31, a supporting unit 32, and a driving unit 33. The holding unit 31 horizontally holds the wafer W. The supporting unit 32 is a vertically extending member, and includes a bottom end rotatably supported by the driving unit 33 and a leading end horizontally supporting the holding unit 31. The driving unit 33 rotates the supporting unit 32 around the vertical axis. The substrate holding mechanism 30 rotates the supporting unit 32 by using the driving unit 33 to rotate the holding unit 31 supported by the supporting unit 32, and consequently rotates the wafer W held on the holding unit 31.

The processing fluid supply unit 40 supplies processing fluid onto the wafer W. The processing fluid supply unit 40 is connected to a processing fluid supply source 70.

The recovery cup 50 is arranged to surround the holding unit 31, and collects processing liquid scattered from the wafer W due to the rotation of the holding unit 31. A drain port 51 is formed on a bottom of the recovery cup 50. The processing liquid collected by the recovery cup 50 is discharged from the drain port 51 to the outside of the processing unit 16. In addition, an exhaust port 52 is formed on the bottom of the recovery cup 50 to discharge gas supplied from the FFU 21 to the outside of the processing unit 16.

Figure 7:
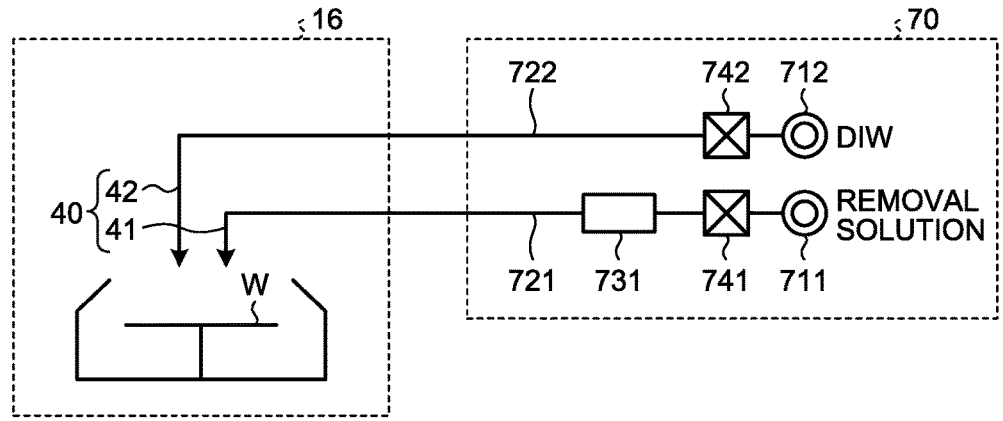
FIG. 7 is a diagram illustrating a configuration example of a processing liquid supply system in the processing unit according to the first embodiment.

Next, a configuration example of a processing liquid supply system in the processing unit 16 will be described with reference to FIG. 7. FIG. 7 is a diagram illustrating a configuration example of a processing liquid supply system in the processing unit 16 according to the first embodiment.

For example, as illustrated in FIG. 7, the processing unit 16 includes a removal solution supply nozzle 41 and a DIW supply nozzle 42 that act as the processing fluid supply unit 40. The removal solution supply nozzle 41 is a nozzle that supplies removal solution onto the wafer W. The DIW supply nozzle 42 is a nozzle that supplies DIW as rinse liquid onto the wafer W.

The processing fluid supply source 70 includes a removal solution supply source 711, a removal solution supply route 721, a temperature regulating unit 731, and a valve 741, which act as a supply system of removal solution.

The removal solution supply source 711 is a tank that retains removal solution, namely, mixed solution of a sulfuric acid, a nitric acid, and water. The removal solution supply route 721 is piping configured to connect the removal solution supply source 711 to the removal solution supply nozzle 41. The temperature regulating unit 731 is provided on the removal solution supply route 721 to heat removal solution supplied by the removal solution supply route 721. The temperature regulating unit 731 is a heater, for example. The valve 741 is provided on the removal solution supply route 721 to open and close the removal solution supply route 721.

The removal solution previously retained in the removal solution supply source 711 supplied by the removal solution supply route 721 by driving the valve 741 from a closed state to an opened state, is heated by the temperature regulating unit 731, and is supplied from the removal solution supply nozzle 41 onto the wafer W.

The processing fluid supply source 70 further includes a DIW supply source 712, a DIW supply route 722, and a valve 742, which act as a supply system of DIW. DIW is supplied from the DIW supply source 712 to the DIW supply nozzle 42 via the DIW supply route 722 by driving the valve 742 from a closed state to an opened state, and is supplied from the DIW supply nozzle 42 onto the wafer W.

Specific Operations of Substrate Processing System

Figure 8:
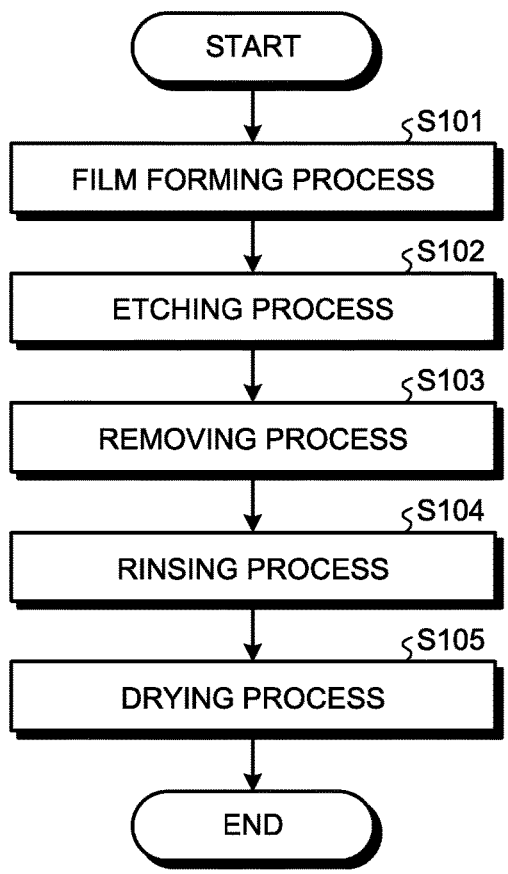
FIG. 8 is a flowchart illustrating an example of the procedure of substrate processing that is executed by the substrate processing system according to the first embodiment.

Next, an example of the specific operations of the substrate processing system 100 will be described with reference to FIG. 8. FIG. 8 is a flowchart illustrating an example of the procedure of substrate processing that is executed by the substrate processing system 100 according to the first embodiment. The processes illustrated in FIG. 8 are performed in accordance with the controls of the controllers 18, 401, and 501.

As illustrated in FIG. 8, in the substrate processing system 100, the wafer W having the silicon oxide film 111 is first carried into the film formation processing unit 201 of the film forming apparatus 200. Then, a film forming process for forming the boron monofilm 112 on the silicon oxide film 111 is performed in the film formation processing unit 201 (Step S101).

Specifically, first, the internal temperature of the processing container 220 is controlled to 200 to 500 degrees Celsius, for example, and the wafer boat 230 in which the plurality of wafers W are placed is inserted into the processing container 220 in an atmospheric-pressure state. Vacuum drawing is performed on the processing container 220 from this state to evacuate the processing container 220. Next, the internal pressure of the processing container 220 is adjusted to a predetermined low-pressure state, e.g., 133.3 Pa (1.0 Torr) to stabilize the temperature of the wafers W. In this state, boron-containing gas such as B2H6 gas is introduced into the processing container 220 by using the boron-containing gas supply mechanism 240, and the boron monofilm 112 is formed on the top face of the wafer W by using CVD for pyrolyzing the boron-containing gas on the top face of the wafer W. After that, inert gas is supplied from the inert gas supply mechanism 250 into the processing container 220 to purge the inside of the processing container 220, and vacuum drawing is performed on the processing container 220 by using the vacuum pump 263. After that, the internal pressure of the processing container 220 is returned to an atmospheric pressure, and then the process is terminated. As a result, the boron monofilm 112 is formed on the silicon oxide film 111 of the wafer W (see FIG. 1A).

The film-forming-processed wafer W is carried out from the film forming apparatus 200, and then is carried into the etching processing unit 301 of the etching apparatus 300. Then, in the etching processing unit 301, an etching process for etching the silicon oxide film 111 of the wafer W is performed by using the boron monofilm 112 as a hard mask (Step S102).

Specifically, the inside of the chamber 310 is depressurized by using the exhaust device 390 and then etching gas is supplied into the chamber 310 from the shower head 340 to perform dry etching on the wafer W placed on the placing pedestal 320. As a result, the concave portion 113 is formed in the wafer W (see FIG. 1B).

The etching-processed wafer W is carried out from the etching apparatus 300, and then is carried into the processing unit 16 of the substrate processing apparatus 1. The wafer W carried into the processing unit 16 is horizontally held by the holding unit 31 in a state where the boron monofilm 112 formed on the silicon oxide film 111 is upward. After that, a removing process for removing the boron monofilm 112 from the wafer W is performed in the processing unit 16 (Step S103).

Specifically, in the removing process, the removal solution supply nozzle 41 of the processing fluid supply unit 40 is located at the middle position over the wafer W. After that, removal solution is supplied from the removal solution supply nozzle 41 onto the wafer W by opening the valve 741 for a predetermined time (see FIG. 1C). The removal solution supplied onto the wafer W spreads on the top face of the wafer W due to a centrifugal force induced by the rotation of the wafer W by the driving unit 33 (see FIG. 6). As a result, the boron monofilm 112 is removed from the wafer W (see FIG. 1D).

Next, a rinsing process for rinsing the top face of the wafer W with DIW is performed in the processing unit 16 (Step S104). In the rinsing process, the DIW supply nozzle 42 is located at the middle position over the wafer W. After that, DIW is supplied from the DIW supply nozzle 42 onto the top face of the rotating wafer W by opening the valve 742 for a predetermined time, and thus the boron monofilm 112 removed (exfoliated) from the wafer W and removal solution remaining on the wafer W are washed away by the DIW.

Next, in the processing unit 16, a drying process for drying the wafer W is performed in which DIW remaining on the top face of the wafer W is shaken off from the top face by increasing the rotational speed of the wafer W for a predetermined time (Step S105). After that, the rotation of the wafer W is stopped.

The drying-processed wafer W is taken out from the processing unit 16 by using the substrate transfer device 17, and is accommodated in the carrier C placed in the carrier placing section 11 by way of the delivery unit 14 and the substrate transfer device 13. As a result, substrate processing consisting of the series of processes performed on one of the wafers W is completed.

As described above, the substrate processing system 100 according to the first embodiment includes the film forming apparatus 200, the etching apparatus 300, and the substrate processing apparatus 1. The film forming apparatus 200 forms the boron monofilm 112 on the wafer W (example of substrate) having films including the silicon oxide film 111. The etching apparatus 300 etches the wafer W on which the boron monofilm 112 is formed by the film forming apparatus 200. The substrate processing apparatus 1 removes the boron monofilm 112 from the wafer W etched by the etching apparatus 300. In addition, the substrate processing apparatus 1 includes the holding unit 31, the processing fluid supply unit 40, and the processing fluid supply source 70. The holding unit 31 holds the wafer W. The processing fluid supply unit 40 and the processing fluid supply source 70 bring removal solution of a sulfuric acid, a nitric acid, and water into contact with the wafer W held by the holding unit 31 so as to remove the boron monofilm 112 from the wafer W.

Therefore, according to the substrate processing system 100 according to the first embodiment, it is possible to appropriately remove the boron monofilm 112 from the wafer W.

Second Embodiment

Next, the second embodiment will be described. In the following descriptions, the same components as those described already have the same reference numbers and the overlapping explanations are omitted.

FIG. 9 is a diagram illustrating a configuration example of a processing liquid supply system in a processing unit according to the second embodiment. As illustrated in FIG. 9, a processing fluid supply source 70A according to the second embodiment includes a sulfuric acid supply source 713, a sulfuric acid supply route 723, a temperature regulating unit 733, and a valve 743, which act as a supply system of a sulfuric acid.

The sulfuric acid supply source 713 is a tank that retains a sulfuric acid diluted with water (deionized water) in a predetermined concentration. For example, a sulfuric acid diluted in the concentration of 50% is retained in the sulfuric acid supply source 713.

The sulfuric acid supply route 723 is piping configured to connect the sulfuric acid supply source 713 to a mixing unit 750 to be described later. The temperature regulating unit 733 is provided on the sulfuric acid supply route 723 to heat a sulfuric acid supplied by the sulfuric acid supply route 723. The temperature regulating unit 733 is a heater, for example. The valve 743 is provided on the sulfuric acid supply route 723 to open and close the sulfuric acid supply route 723.

The processing fluid supply source 70A includes a nitric acid supply source 714, a nitric acid supply route 724, and a valve 744, which act as a supply system of a nitric acid.

The nitric acid supply source 714 is a tank that retains a nitric acid diluted with water (deionized water) in a predetermined concentration. For example, a nitric acid diluted in the concentration of 69% is retained in the nitric acid supply source 714.

The nitric acid supply route 724 is piping configured to connect the nitric acid supply source 714 to the mixing unit 750 to be described later. The valve 744 opens and closes the nitric acid supply route 724.

The processing fluid supply source 70A includes the DIW supply source 712, the DIW supply route 722, and the valve 742, which act as a supply system of DIW.

A processing unit 16A includes the mixing unit 750 and a removal solution supply route 760. The mixing unit 750 mixes a sulfuric acid supplied from the sulfuric acid supply route 723 at a predetermined flow speed with a nitric acid supplied from the nitric acid supply route 724 at a predetermined flow speed, at a preset mixing ratio in a state where a flow speed is maintained, so as to generate removal solution that is mixed solution. For example, the mixing unit 750 mixes a sulfuric acid with concentration of 50% and a nitric acid with concentration of 69% at the ratio of 10:1.

The mixing unit 750 is arranged within the chamber 20 (see FIG. 6) of the processing unit 16A. For example, the mixing unit 750 may be provided in an arm that holds the removal solution supply nozzle 41.

The removal solution supply route 760 connects the mixing unit 750 and the removal solution supply nozzle 41 to supply removal solution generated in the mixing unit 750 to the removal solution supply nozzle 41.

Next, a removing process according to the second embodiment will be described. In the removing process according to the second embodiment, the etching-processed wafer W is held by the holding unit 31, and then the removal solution supply nozzle 41 of the processing fluid supply unit 40 is located at the middle position over the wafer W.

After that, the valve 743 and the valve 744 are opened for a predetermined time, and thus a sulfuric acid diluted with water and heated by the temperature regulating unit 733 and a nitric acid diluted with water flow into the mixing unit 750 to generate removal solution.

After that, the removal solution generated in the mixing unit 750 is supplied from the removal solution supply nozzle 41 onto the wafer W. The removal solution supplied onto the wafer W spreads on the top face of the wafer W due to a centrifugal force induced by the rotation of the wafer W by the driving unit 33. As a result, the boron monofilm 112 is removed from the wafer W.

As described above, the processing unit 16A according to the second embodiment includes the processing fluid supply unit 40 and the processing fluid supply source 70A. Specifically, the processing unit 16A includes the sulfuric acid supply route 723, the nitric acid supply route 724, the mixing unit 750, and the removal solution supply nozzle 41. A water-diluted sulfuric acid supplied from the sulfuric acid supply source 713 that supplies a sulfuric acid diluted with water supplied by the sulfuric acid supply route 723. A water-diluted nitric acid supplied from the nitric acid supply source 714 that supplies a nitric acid diluted with water supplied by the nitric acid supply route 724. Before supplying removal solution onto the wafer W, the mixing unit 750 mixes the water-diluted sulfuric acid supplied by the sulfuric acid supply route 723 and the water-diluted nitric acid supplied by the nitric acid supply route 724, in a state where a flow speed is maintained. The removal solution supply nozzle 41 supplies the removal solution generated by the mixing unit 750 onto the wafer W.

According to the processing unit 16A, because the generated removal solution immediately arrives at the wafer W due to its flow speed, more fresh removal solution, namely, removal solution before removal performance of the boron monofilm 112 is decreased can be supplied onto the wafer W compared with a case where removal solution is previously generated and retained in a tank, for example. Therefore, according to the processing unit 16A of the second embodiment, it is possible to more appropriately remove the boron monofilm 112.

The processing unit 16A does not necessarily include the temperature regulating unit 733. Therefore, the processing unit 16A may supply removal solution heated by the heat of reaction between the sulfuric acid and nitric acid onto the wafer W. In this case, for example, a temperature change of removal solution induced by heat of reaction after mixing the sulfuric acid and nitric acid is previously measured through experiments. By using the measured temperature change, it is preferable to optimize the length of the removal solution supply route 760 so that removal solution is in contact with the wafer W when the temperature of the removal solution is within a predetermined range including the maximum value.

The processing unit 16A may generate higher-concentration removal solution than a desired concentration in the mixing unit 750, and supply the removal solution from the removal solution supply nozzle 41 onto the wafer W and supply DIW from the DIW supply nozzle 42 onto the wafer W to dilute the high-concentration removal solution with the DIW on the wafer W. In this way, the processing unit 16A may generate desired-concentration removal solution.

Third Embodiment

FIG. 10 is a diagram illustrating a configuration example of a processing liquid supply system in a processing unit 16B according to the third embodiment. As illustrated in FIG. 10, the processing unit 16B according to the third embodiment includes the DIW supply nozzle 42, a sulfuric acid supply nozzle 43 (example of strong acid supply nozzle), and a nitric acid supply nozzle 44, which act as a processing fluid supply unit 40B.

The sulfuric acid supply nozzle 43 is a nozzle that supplies a sulfuric acid onto the wafer W, and the nitric acid supply nozzle 44 is a nozzle that supplies a nitric acid onto the wafer W.

A processing fluid supply source 70B includes the sulfuric acid supply source 713, the sulfuric acid supply route 723, the temperature regulating unit 733, and the valve 743, which act as a supply system of a sulfuric acid. The sulfuric acid supply route 723 is connected to the sulfuric acid supply nozzle 43.

The processing fluid supply source 70B further includes the nitric acid supply source 714, the nitric acid supply route 724, and the valve 744, which act as a supply system of a nitric acid. The nitric acid supply route 724 is connected to the nitric acid supply nozzle 44.

The processing fluid supply source 70B further includes the DIW supply source 712, the DIW supply route 722, and the valve 742, which act as a supply system of DIW. The DIW supply route 722 is connected to the DIW supply nozzle 42.

Next, a removing process according to the third embodiment will be described. In the removing process according to the third embodiment, the etching-processed wafer W is held by the holding unit 31, and then the sulfuric acid supply nozzle 43 and the nitric acid supply nozzle 44 of the processing fluid supply unit 40B are located above the wafer W. After that, the valve 743 and the valve 744 are opened for a predetermined time, and thus a sulfuric acid diluted with water and heated by the temperature regulating unit 733 and a nitric acid diluted with water are respectively supplied from the sulfuric acid supply nozzle 43 and the nitric acid supply nozzle 44 onto the wafer W. The flow volumes of the sulfuric acid and nitric acid are adjusted by the valves 743 and 744 so as to become a predetermined flow ratio. For example, the flow ratio of the sulfuric acid and nitric acid is adjusted to be 10:1.

Removal solution is generated on the wafer W by mixing on the wafer W the sulfuric acid and nitric acid supplied onto the wafer W. The generated removal solution spreads on the top face of the wafer W due to a centrifugal force induced by the rotation of the wafer W by the driving unit 33. As a result, the boron monofilm 112 is removed from the wafer W.

As described above, the processing unit 16B according to the third embodiment includes the processing fluid supply unit 40B and the processing fluid supply source 70B. Specifically, the processing unit 16B includes the sulfuric acid supply route 723, the nitric acid supply route 724, the sulfuric acid supply nozzle 43, and the nitric acid supply nozzle 44. A water-diluted sulfuric acid supplied from the sulfuric acid supply source 713 that supplies a sulfuric acid diluted with water supplied by the sulfuric acid supply route 723. A water-diluted nitric acid supplied from the nitric acid supply source 714 that supplies a nitric acid diluted with water supplied by the nitric acid supply route 724. The sulfuric acid supply nozzle 43 supplies the water-diluted sulfuric acid circulating through the sulfuric acid supply route 723 onto the wafer W. The nitric acid supply nozzle 44 supplies the water-diluted nitric acid circulating through the nitric acid supply route 724 onto the wafer W. Then, in the removing process according to the third embodiment, the sulfuric acid diluted with water and the nitric acid diluted with water are supplied onto the wafer W held by the holding unit 31 to generate removal solution on the wafer W, and consequently the boron monofilm 112 is removed.

According to the processing unit 16B, comparatively fresh removal solution having a short time after generation can be supplied onto the wafer W in a more simple configuration as compared with the configuration that includes the mixing unit 750.

Fourth Embodiment

Figure 11A:
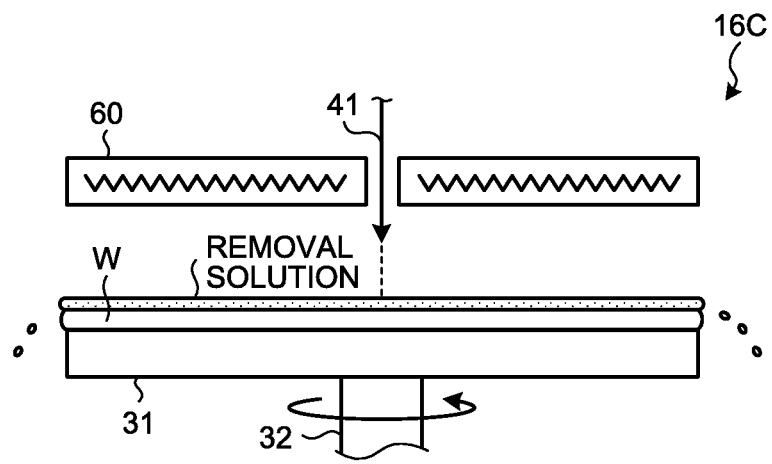
FIGS. 11A and 11B are diagrams illustrating a configuration example of a processing unit according to a fourth embodiment.
Figure 11B:
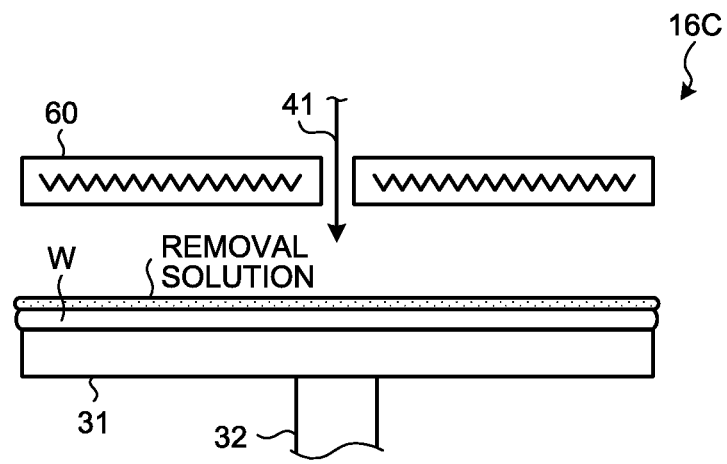

Next, the fourth embodiment will be described. FIGS. 11A and 11B are diagrams illustrating a configuration example of a processing unit 16C according to the fourth embodiment.

As illustrated in FIG. 11A, the processing unit 16C according to the fourth embodiment includes a heating unit 60. The heating unit 60 is, for example, a resistance heater or a lamp heater. The heating unit 60 is arranged over the holding unit 31 separately from the holding unit 31. On the other hand, the heating unit 60 may be provided to be integrated with the holding unit 31. For example, the heating unit 60 may be embedded in the holding unit 31.

Next, a removing process according to the fourth embodiment will be described. In the removing process according to the fourth embodiment, a solution film of removal solution is formed on the upper surface of the etching-processed wafer W held by the holding unit 31 (solution film forming process).

For example, as illustrated in FIG. 11A, removal solution is supplied onto the wafer W from the removal solution supply nozzle 41, and a solution film of the removal solution is formed on the wafer W by rotating the wafer W by using the driving unit 33 (see FIG. 6).

The present embodiment is not limited to the above example. The present embodiment may have an example in which a sulfuric acid and a nitric acid are supplied onto the rotating wafer W from the sulfuric acid supply nozzle 43 and the nitric acid supply nozzle 44 and removal solution is generated on the wafer W so as to form a solution film of the removal solution on the wafer W.

Next, as illustrated in FIG. 11B, after the solution film forming process, a state where the solution film of removal solution is formed on the wafer W is maintained for a predetermined time (maintaining process). Specifically, the rotation of the wafer W is stopped and the supply of removal solution from the removal solution supply nozzle 41 onto the wafer W is stopped to make the same removal solution stay on the wafer W for a predetermined time.

As a result, as compared with a case where the rotation of the wafer W and the supply of removal solution onto the wafer W from the removal solution supply nozzle 41 are continued (namely, the replacement of removal solution is continued), for example, it is possible to enhance removal efficiency of the boron monofilm 112. The reason is because a reactant between boron and removal solution acts as etchant so as to accelerate the removal of the boron monofilm 112.

In the maintaining process, the processing unit 16C heats the removal solution on the wafer W by using the heating unit 60 to keep the temperature of the removal solution on the wafer W constant. As a result, it is possible to suppress the degradation of removal performance caused by a decrease in temperature.

As described above, in the removing process, the processing unit 16C according to the fourth embodiment performs a solution film forming process for forming a solution film of removal solution on the wafer W held by the holding unit 31 and a maintaining process for maintaining a state where the solution film of removal solution is formed on the wafer W for a predetermined time after the solution film forming process. Specifically, in the maintaining process, the processing unit 16C makes the same removal solution stay on the wafer W for a predetermined time.

As a result, as compared with a case where the replacement of removal solution on the wafer W is continued, it is possible to enhance removal efficiency of the boron monofilm 112. In addition, it is possible to reduce a used amount of removal solution.

Fifth Embodiment

Figure 12:
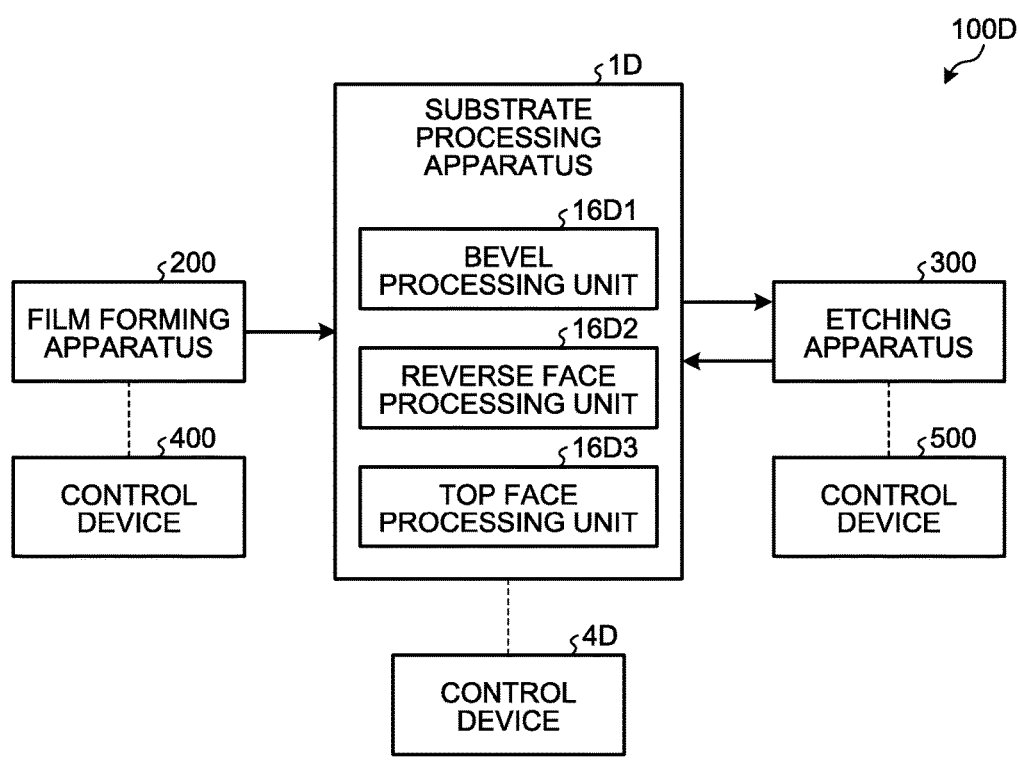
FIG. 12 is a diagram illustrating a configuration example of a substrate processing system according to a fifth embodiment.

Next, the fifth embodiment will be described. FIG. 12 is a diagram illustrating a configuration example of a substrate processing system 100D according to the fifth embodiment.

As illustrated in FIG. 12, the substrate processing system 100D according to the fifth embodiment includes the film forming apparatus 200, the etching apparatus 300, and a substrate processing apparatus 1D.

In the substrate processing system 100D, between the film forming process and the etching process, a preliminary removing process for removing the boron monofilm 112 from the reverse face and bevel face of the wafer W is performed by bringing removal solution into contact with the reverse face and bevel face of the wafer W.

The substrate processing apparatus 1D includes a bevel processing unit 16D1, a reverse face processing unit 16D2, and a top face processing unit 16D3. In addition, the substrate processing apparatus 1D is connected to a control device 4D. Operations of the bevel processing unit 16D1, the reverse face processing unit 16D2, and the top face processing unit 16D3 are controlled by the control device 4D.

Figure 13:
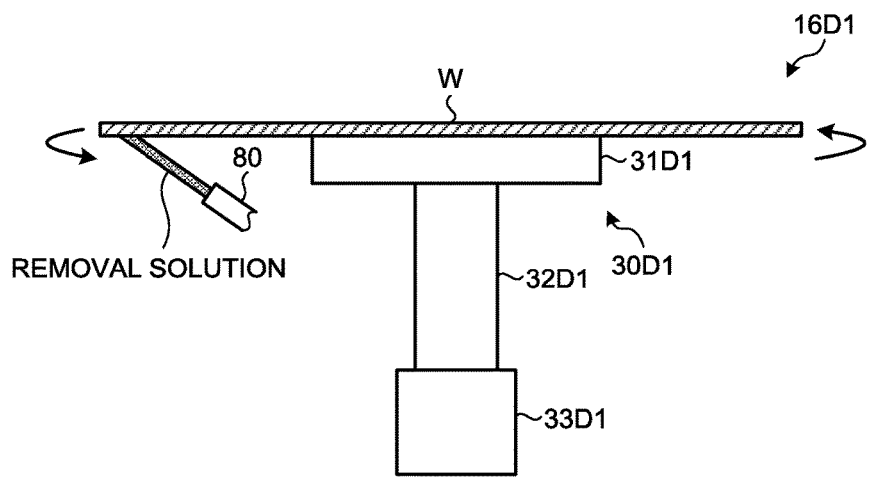
FIG. 13 is a diagram illustrating a configuration example of a bevel processing unit.

The bevel processing unit 16D1 removes the boron monofilm 112 formed on the bevel face of the wafer W by using removal solution. Herein, a configuration example of the bevel processing unit 16D1 will be described with reference to FIG. 13. FIG. 13 is a diagram illustrating a configuration example of the bevel processing unit 16D1.

As illustrated in FIG. 13, the bevel processing unit 16D1 includes a substrate holding mechanism 30D1 and a bevel supply unit 80.

The substrate holding mechanism 30D1 includes a holding unit 31D1 that adsorbs and holds the wafer W, a supporting member 32D1 that supports the holding unit 31D1, and a driving unit 33D1 that rotates the supporting member 32D1. The holding unit 31D1 is connected to a suction device such as a vacuum pump to horizontally hold the wafer W by adsorbing the reverse face of the wafer W by using a negative pressure generated by the suction of the suction device. For example, a porous chuck can be used as the holding unit 31D1.

The bevel supply unit 80 is provided on, for example, a bottom of a recovery cup (not illustrated) to supply removal solution to the peripheral edge of the reverse side of the wafer W. For example, the processing fluid supply source 70 illustrated in FIG. 7 or the processing fluid supply source 70A illustrated in FIG. 9 can be employed as the configuration of a supply system of removal solution.

The bevel processing unit 16D1 configured as described above holds the wafer W by using the holding unit 31D1 and rotates the wafer W by using the driving unit 33D1, and then supplies removal solution to the peripheral edge of the reverse side of the wafer W from the bevel supply unit 80. The removal solution supplied to the peripheral edge of the reverse side of the wafer W comes around the bevel face of the wafer W to remove the boron monofilm 112 formed on the bevel face. After that, the rotation of the wafer W is stopped.

The bevel supply unit 80 is connected to a DIW supply source (not illustrated). The bevel supply unit 80 removes the boron monofilm 112 from the bevel face of the wafer W and then supplies DIW to the peripheral edge of the reverse side of the wafer W to perform a rinsing process for washing away the boron monofilm 112 and removal solution remaining on the bevel face.

Figure 14:
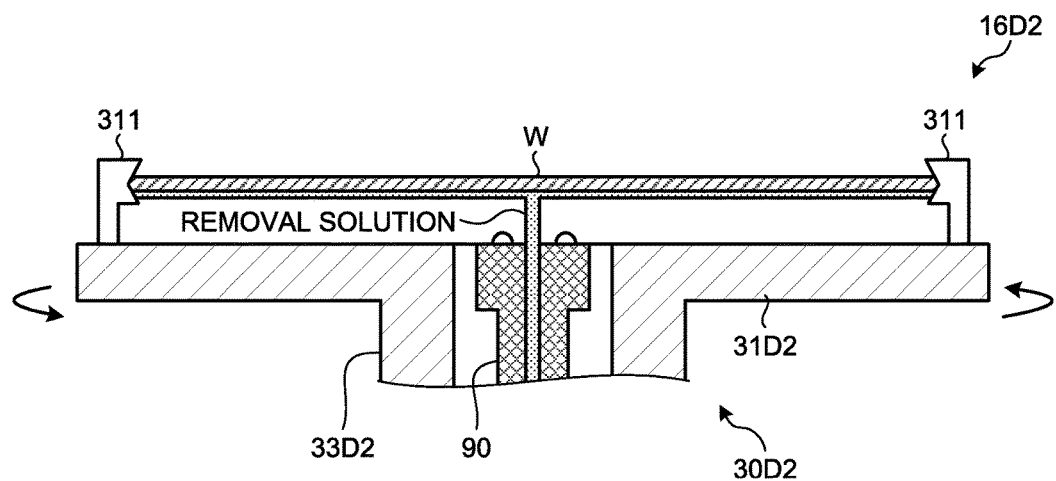
FIG. 14 is a diagram illustrating a configuration example of a reverse face processing unit.

The reverse face processing unit 16D2 removes the boron monofilm 112 formed on the reverse face of the wafer W by using removal solution. Herein, a configuration example of the reverse face processing unit 16D2 will be described with reference to FIG. 14. FIG. 14 is a diagram illustrating a configuration example of the reverse face processing unit 16D2.

As illustrated in FIG. 14, the reverse face processing unit 16D2 includes a substrate holding mechanism 30D2 configured to rotatably hold the wafer W and a reverse face supply unit 90 that is inserted into a hollow part of the substrate holding mechanism 30D2 to supply removal solution onto the reverse face of the wafer W.

A plurality of grippers 311 that grips the peripheral edge of the wafer W is provided on the upper surface of the substrate holding mechanism 30D2. The wafer W is horizontally held in a state where it is slightly apart from the upper surface of the substrate holding mechanism 30D2 by using the plurality of grippers 311.

The substrate holding mechanism 30D2 includes a driving unit 33D2 to rotate around a vertical axis by using the driving unit 33D2. Then, due to the rotation of the substrate holding mechanism 30D2, the wafer W held in the substrate holding mechanism 30D2 is rotated integrally with the substrate holding mechanism 30D2.

The reverse face supply unit 90 is inserted into the hollow part of the substrate holding mechanism 30D2 to supply removal solution to the central portion of the reverse face of the wafer W. For example, the processing fluid supply source 70 illustrated in FIG. 7 or the processing fluid supply source 70A illustrated in FIG. 9 can be employed as the configuration of a supply system of removal solution.

The reverse face processing unit 16D2 configured as described above holds the wafer W by using the plurality of grippers 311 of the substrate holding mechanism 30D2 and rotates the wafer W by using the driving unit 33D2, and then supplies removal solution to the central portion of the reverse face of the wafer W from the reverse face supply unit 90. The removal solution supplied to the central portion of the reverse face of the wafer W spreads on the reverse face of the wafer W due to a centrifugal force induced by the rotation of the wafer W to remove the boron monofilm 112 formed on the reverse face. After that, the rotation of the wafer W is stopped.

The reverse face supply unit 90 is connected to a DIW supply source (not illustrated). After removing the boron monofilm 112 from the reverse face of the wafer W, the reverse face supply unit 90 supplies DIW to the central portion of the reverse face of the wafer W to perform a rinsing process for washing away the boron monofilm 112 and removal solution remaining on the reverse face.

The top face processing unit 16D3 removes the boron monofilm 112 formed on the top face of the wafer W. Any of the processing units 16 and 16A to 16C can be applied to the top face processing unit 16D3.

Next, the procedure of substrate processing according to the fifth embodiment will be described. In the substrate processing system 100D according to the fifth embodiment, a film forming process by the film forming apparatus 200 is finished, and then the film-formation-processed wafer W is carried into the bevel processing unit 16D1 of the substrate processing apparatus 1D. Then, a bevel removing process for removing the boron monofilm 112 formed on the bevel face of the wafer W is performed in the bevel processing unit 16D1.

Next, the rinsing and drying processes are performed on the bevel-removing-processed wafer W in the bevel processing unit 16D1, and then the wafer W is carried into the reverse face processing unit 16D2. A reverse-face removing process for removing the boron monofilm 112 formed on the reverse face of the wafer W is performed in the reverse face processing unit 16D2.

Next, the rinsing and drying processes are performed on the reverse-face-removing-processed wafer W in the reverse face processing unit 16D2, and then the wafer W is carried out from the substrate processing apparatus 1D and is carried into the etching apparatus 300. Then, an etching process is performed in the etching apparatus 300.

Next, the etching-processed wafer W is carried into the top face processing unit 16D3 of the substrate processing apparatus 1D, and then the removing, rinsing, and drying processes described above are performed on the wafer W in the top face processing unit 16D3.

As described above, in the substrate processing system 100D according to the fifth embodiment, between the film forming process and the etching process, a preliminary removing process for removing the boron monofilm 112 from the reverse face and bevel face of the wafer W is performed by bringing removal solution into contact with the reverse face and bevel face of the wafer W. As a result, the boron monofilm 112 on the reverse face and bevel face unnecessary for an etching process can be removed before the etching process.

Herein, it has been explained that a reverse-face removing process is performed after a bevel removing process. However, the bevel removing process may be performed after the reverse-face removing process. On the other hand, the bevel supply unit 80 and the reverse face supply unit 90 may be provided in one processing unit to simultaneously perform the bevel removing process and reverse-face removing process.

Herein, it has been explained that the one substrate processing apparatus 1D includes all of the bevel supply unit 80, the reverse face supply unit 90, and the processing fluid supply unit 40. However, the substrate processing system 100D may include a first substrate processing apparatus including the bevel supply unit 80 and the reverse face supply unit 90 and a second substrate processing apparatus including the processing fluid supply unit 40.

Sixth Embodiment

Figure 15A:
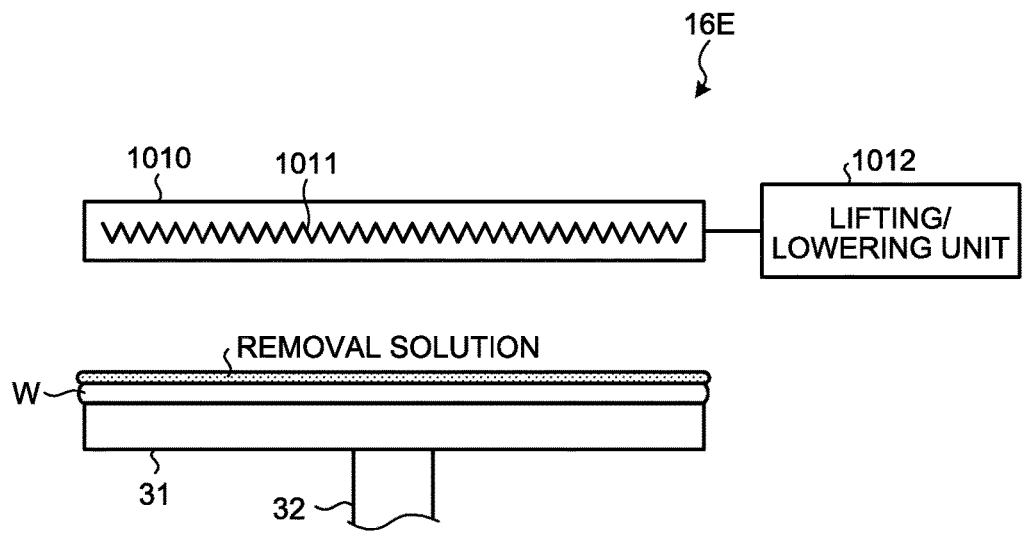
FIGS. 15A and 15B are diagrams illustrating a configuration example of a processing unit according to a sixth embodiment.
Figure 15B:
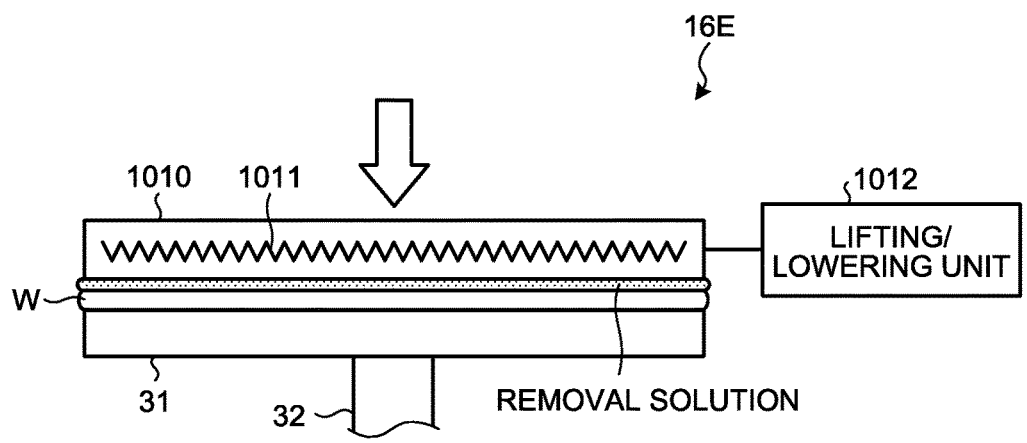

Next, the sixth embodiment will be described. FIGS. 15A and 15B are diagrams illustrating a configuration example of a processing unit 16E according to the sixth embodiment.

As illustrated in FIG. 15A, the processing unit 16E according to the sixth embodiment includes a cover body 1010. The cover body 1010 is arranged over the holding unit 31. The cover body 1010 faces the wafer W held on the holding unit 31, and the facing face of the cover body has the same diameter as that of the wafer W or a larger diameter than that of the wafer W.

A heating unit 1011 such as a heater is embedded in the cover body 1010. On the other hand, the heating unit 1011 may be embedded in the holding unit 31 or may be embedded in both of the cover body 1010 and the holding unit 31. Furthermore, the processing unit 16E includes a lifting/lowering unit 1012 that lifts and lowers the cover body 1010.

Next, a removing process according to the sixth embodiment will be described. In the removing process according to the sixth embodiment, a solution film of removal solution is formed on the upper surface of the etching-processed wafer W held by the holding unit 31 (solution film forming process).

For example, removal solution is supplied onto the wafer W from the removal solution supply nozzle 41 (see FIG. 7 etc.) and the wafer W is rotated by the driving unit 33 (see FIG. 6), and thus a solution film of removal solution is formed on the wafer W. Alternatively, the sulfuric acid and nitric acid may be supplied onto the rotating wafer W from the sulfuric acid supply nozzle 43 and the nitric acid supply nozzle 44 (see FIG. 10) to generate removal solution on the wafer W, and thus a solution film of removal solution may be formed on the wafer W.

Next, after stopping the rotation of the wafer W and stopping the supply of the removal solution or the sulfuric acid and nitric acid from the removal solution supply nozzle 41 onto the wafer W after the solution film forming process, the cover body 1010 is brought into contact with the solution film of removal solution by lowering the cover body 1010 by using the lifting/lowering unit 1012 as illustrated in FIG. 15B. Then, in a state where the cover body 1010 is in contact with the solution film of removal solution, the removal solution is heated by using the heating unit 1011 while making the same removal solution stay on the wafer W for a predetermined time (maintaining process).

The inventors of the present invention have discovered that gas is generated from removal solution by heating the removal solution. Furthermore, the inventors of the present invention has discovered that gas goes out of the removal solution and thus reactivity between the removal solution and the boron monofilm 112 is decreased. Therefore, according to the sixth embodiment, gas does not go out of the removal solution to the utmost by bring the cover body 1010 into contact with the solution film of removal solution to reduce the exposed area of the solution film. As a result, it is possible to suppress the degradation of reactivity of removal solution caused by the generation of gas.

After that, after stopping heating by the heating unit 1011 and lifting the cover body 1010 by using the lifting/lowering unit 1012, the removal solution is removed from the wafer W by rotating the holding unit 31 by using the driving unit 33 (see FIG. 6). Next, removal solution remaining on the wafer W is removed by supplying DIW that is rinse liquid from the DIW supply nozzle 42 (see FIG. 7 etc.) onto the wafer W (rinsing process).

Next, the DIW is removed from the wafer W by increasing the rotation speed of the wafer W so as to dry the wafer W (drying process). After that, the rotation of the wafer W is stopped and the wafer W is carried out from the processing unit 16E. Then, the substrate processing is completed.

In the embodiments described above, the holding unit 31 that adsorbs and holds the wafer W from the lower side has been explained as an example. However, the removing process may be performed by using a holding unit that grips the peripheral edge of the wafer W by using the plurality of grippers 311, for example, like the substrate holding mechanism 30D2 illustrated in FIG. 14.

In the embodiments described above, removal solution is supplied onto the wafer W and then the rinsing and drying processes are performed, but the present disclosure is not limited thereto. After supplying removal solution onto the wafer W, a process for supplying a nitric acid onto the wafer W may be performed before performing a rinsing process. For example, in the processing unit 16A illustrated in FIG. 9 or the processing unit 16B illustrated in FIG. 10, only the valve 743 is closed and the valve 744 is further opened for a predetermined time after opening the valves 743 and 744 for a predetermined time. In this way, a nitric acid can be supplied onto the wafer W before a rinsing process.

In the embodiments described above, it has been explained that removal solution is brought into contact with the wafer W by supplying the removal solution onto the wafer W from the removal solution supply nozzle 41 or by respectively supplying the sulfuric acid and nitric acid from the sulfuric acid supply nozzle 43 and the nitric acid supply nozzle 44. However, a method for bringing removal solution into contact with the wafer W is not limited thereto.

For example, by immersing a batch (example of holding unit), which can hold the plurality of wafers W, in removal solution retained in a processing tank after holding the plurality of wafers W in the batch (holding process), the removal solution is brought into contact with the wafers W so as to remove the boron monofilm 112 from the wafers W (removing process). As a result, it is possible to process the plurality of wafers W held in the batch at a time.

Seventh Embodiment

Figure 16A:
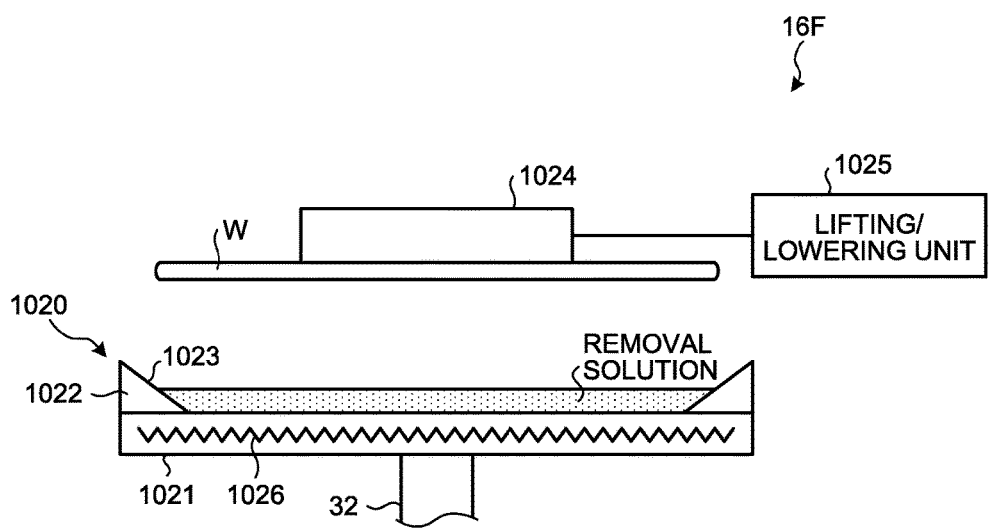
FIGS. 16A and 16B are diagrams illustrating a configuration example of a processing unit according to a seventh embodiment.
Figure 16B:
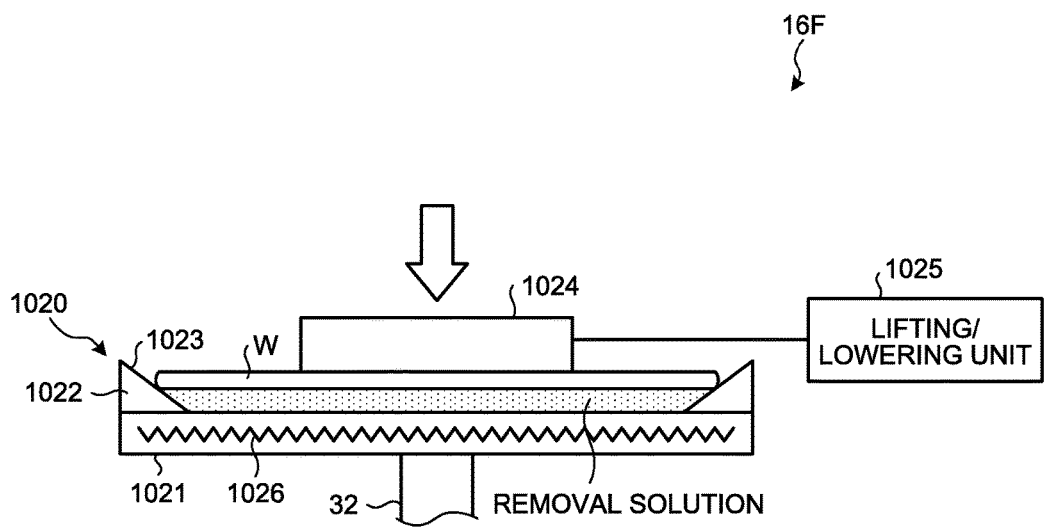

Next, the seventh embodiment will be described. FIGS. 16A and 16B are diagrams illustrating a configuration example of a processing unit 16F according to the seventh embodiment.

As illustrated in FIG. 16A, the processing unit 16F according to the seventh embodiment includes a dish-shaped placing unit 1020. The placing unit 1020 includes, for example, a disk-shaped bottom 1021 connected to the supporting unit 32 and a toric peripheral wall 1022 provided on the upper surface of the bottom 1021. The peripheral wall 1022 has an inner circumferential surface 1023 whose diameter is gradually reduced downward to contact with the bevel face of the wafer W on the inner circumferential surface 1023. The wafer W is placed on the placing unit 1020 in a state where the wafer is away from the bottom 1021 by bringing the bevel face into contact with the inner circumferential surface 1023. Herein, it is assumed that the bottom 1021 and the peripheral wall 1022 are separated from each other. However, the bottom 1021 and the peripheral wall 1022 may be integrated with each other.

The processing unit 16F includes a holding unit 1024 and a lifting/lowering unit 1025. The holding unit 1024 holds the wafer W from above in a state where a surface on which the boron monofilm 112 is formed is placed downward. For example, a vacuum chuck, a Bernoulli chuck, etc. for adsorbing and holding the wafer W can be used as the holding unit 1024. The lifting/lowering unit 1025 lifts and lowers the holding unit 1024.

A heating unit 1026 such as a heater is embedded in the bottom 1021 of the placing unit 1020. On the other hand, it is only sufficient that the heating unit 1026 is embedded in at least one of the bottom 1021, the peripheral wall 1022, and the holding unit 1024.

Next, a removing process according to the seventh embodiment will be described. In the removing process according to the seventh embodiment, removal solution is first stored in the dish-shaped placing unit 1020 by using the removal solution supply nozzle 41 (see FIG. 7 etc.) or the sulfuric acid supply nozzle 43 and the nitric acid supply nozzle 44 (see FIG. 10).

Next, the wafer W held by the holding unit 1024 is brought into contact with the removal solution stored in the placing unit 1020 by lowering the holding unit 1024 by using the lifting/lowering unit 1025 (see FIG. 16B). Then, in a state where the wafer W is in contact with the removal solution, the removal solution is heated by using the heating unit 1026. As a result, the boron monofilm 112 on the wafer W is removed by the removal solution. In order to suppress the generation of gas, it is preferable to start to heat the removal solution after the wafer W contacts with the removal solution.

After that, the heating of removal solution by the heating unit 1026 is stopped and the holding unit 1024 is lifted by using the lifting/lowering unit 1025.

The removing-processed wafer W is transferred to another processing unit (not illustrated) having the configuration illustrated in FIG. 6, for example, and then DIW that is rinse liquid is supplied from the processing fluid supply unit 40 (the DIW supply nozzle 42) in a state where the wafer is held by the rotating holding unit 31 so as to remove the removal solution from the wafer W. After that, the wafer W is dried by increasing the rotation speed of the wafer W, and then the rotation of the wafer W is stopped and the wafer W is carried out from the processing unit 16F. Then, the substrate processing is completed.

In the processing unit 16F, it has been explained that a process for removing removal solution stored in the placing unit 1020 from the inside of the placing unit 1020 is performed by rotating the placing unit 1020 by using the driving unit 33. However, a method for removing removal solution from the placing unit 1020 is not limited thereto. For example, removal solution may be removed from the placing unit 1020 by providing a lifting/lowering unit, which lifts and lowers the peripheral wall 1022, in the placing unit 1020 to lift the peripheral wall 1022 by using the lifting/lowering unit. Furthermore, removal solution may be discharged from a discharge port by providing the discharge port in the bottom 1021.

According to the processing unit 16F according to the seventh embodiment, as illustrated in FIG. 16B, a state where removal solution is sealed is made by bring the bevel face of the wafer W into contact with the inner circumferential surface 1023 of the peripheral wall 1022 in the placing unit 1020. For this reason, as compared with the processing unit 16E according to the sixth embodiment, gas generated by heating can be more surely restrained from going out of removal solution. Therefore, it is possible to more surely suppress the degradation of reactivity of removal solution caused by the generation of gas.

Eighth Embodiment

Figure 17A:
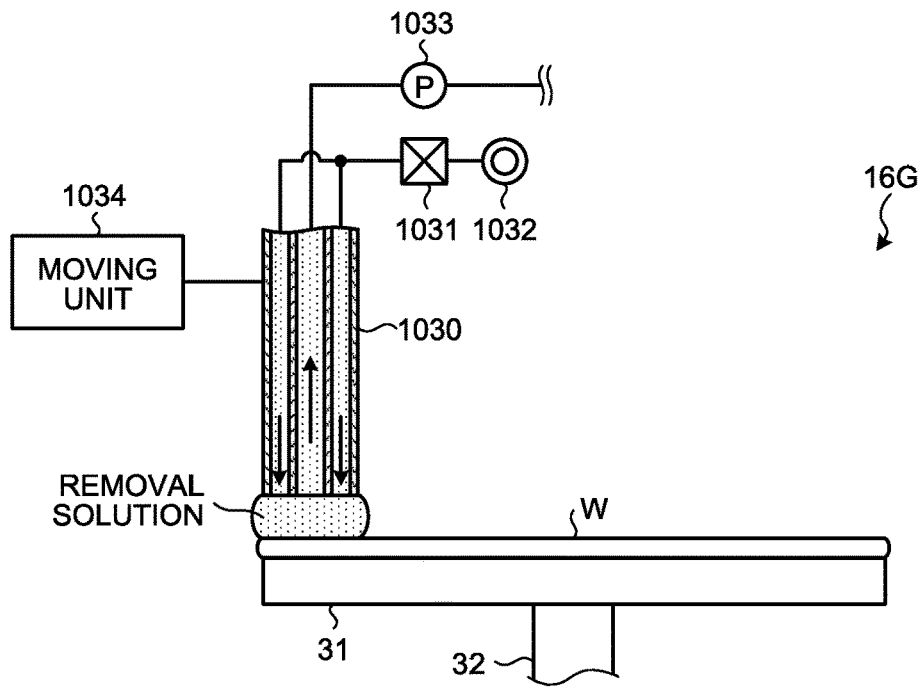
FIGS. 17A and 17B are diagrams illustrating a configuration example of a processing unit according to an eighth embodiment.
Figure 17B:
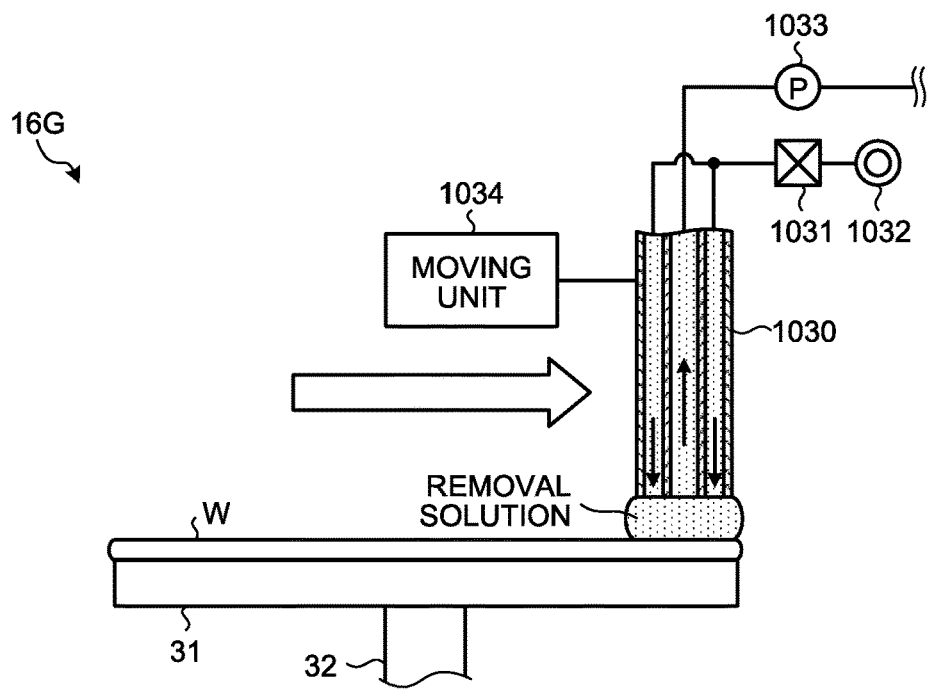

Next, the eighth embodiment will be described. FIGS. 17A and 17B are diagrams illustrating a configuration example of a processing unit 16G according to the eighth embodiment.

As illustrated in FIG. 17A, the processing unit 16G according to the eighth embodiment includes a nozzle 1030. The nozzle 1030 has a double tube structure, for example. A removal solution supply source 1032 is connected to its outer tube via a valve 1031, and a pump 1033 is connected to its inner tube. According to the nozzle 1030, a state where droplets of removal solution are formed between the nozzle 1030 and the wafer W can be maintained by achieving a balance between a flow volume of removal solution supplied from the removal solution supply source 1032 via the valve 1031 and a flow volume of removal solution sucked by the pump 1033. Furthermore, the nozzle 1030 may embed therein a heating unit (not illustrated) such as a heater to heat the removal solution supplied from the removal solution supply source 1032.

The processing unit 16G further includes a moving unit 1034 that moves the nozzle 1030. The moving unit 1034 moves the nozzle 1030 in vertical and horizontal directions.

Next, a removing process according to the eighth embodiment will be described. In the removing process according to the eighth embodiment, the holding unit 31 holds the etching-processed wafer W and then the moving unit 1034 lowers the nozzle 1030 to make the nozzle approach the wafer W. After that, droplets of removal solution are formed between the nozzle 1030 and the wafer W by opening the valve 1031 and activating the pump 1033.

Next, as illustrated in FIG. 17B, the driving unit 33 rotates the wafer W. After that, in a state where the height (position) of the nozzle 1030 is maintained, the moving unit 1034 horizontally moves the nozzle 1030 from one end to another end of the outer circumferential portion of the wafer W so as to supply removal solution onto the entire surface of the wafer W. As a result, the boron monofilm 112 on the wafer W is removed.

After that, the valve 1031 is closed, the pump 1033 is stopped, and the nozzle 1030 is lifted. Next, removal solution remaining on the wafer W is removed by supplying DIW from the DIW supply nozzle 42 onto the wafer W, and the wafer W is dried by increasing the rotation speed of the wafer W. After that, the rotation of the wafer W is stopped and the wafer W is carried out from the processing unit 16G, and then the substrate processing is completed.

As described above, because the removing process of the boron monofilm 112 is performed using the nozzle 1030 that can maintain the state where droplets of removal solution are formed between the wafer W and the nozzle, it is possible to reduce a used amount of removal solution.

Ninth Embodiment

Figure 19:
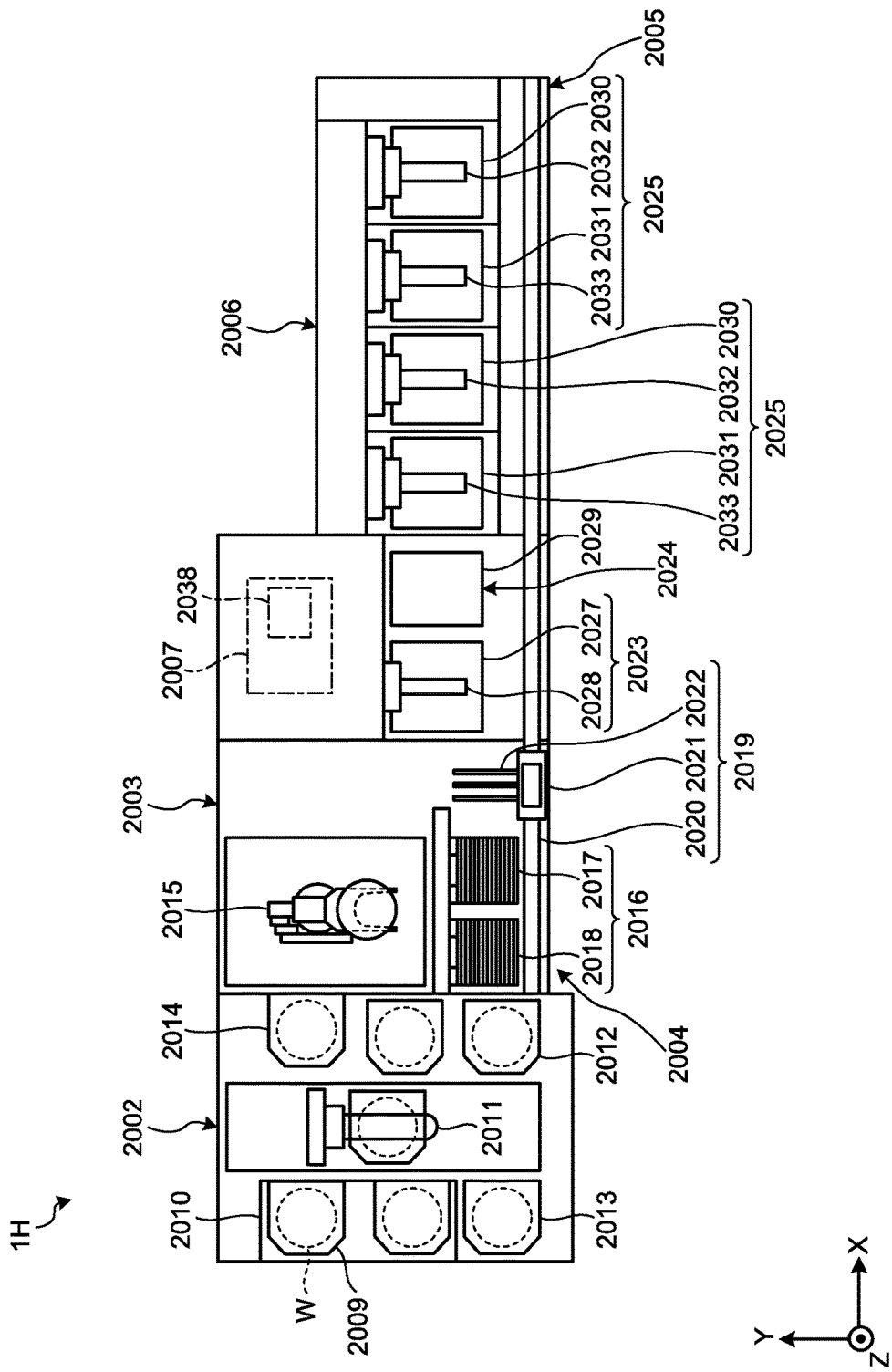
FIG. 19 is a diagram illustrating a configuration example of a substrate processing apparatus according to a ninth embodiment.

Next, the ninth embodiment will be described. FIG. 19 is a diagram illustrating a configuration example of a substrate processing apparatus 1H according to the ninth embodiment.

As illustrated in FIG. 19, the substrate processing apparatus 1H includes a carrier carrying-in/out section 2002, a lot forming section 2003, a lot placing section 2004, a lot transfer section 2005, a lot processing section 2006, and a controller 2007.

The carrier carrying-in/out section 2002 performs the carry-in/out of a carrier 2009 configured to accommodate a plurality of wafers W (for example, 25 wafers) that are vertically arranged in a horizontal posture.

The carrier carrying-in/out section 2002 is provided with a carrier stage 2010 configured to place thereon a plurality of the carriers 2009, a carrier transfer mechanism 2011 configured to transfer one of the carriers 2009, carrier stocks 2012 and 2013 configured to temporarily store the carriers 2009, and a carrier placing pedestal 2014 configured to place thereon the carrier 2009. Herein, the carrier stock 2012 temporarily stores the wafer W to be a product before the wafer is processed in the lot processing section 2006. Furthermore, the carrier stock 2013 temporarily stores the wafer W to be a product after the wafer is processed in the lot processing section 2006.

Then, the carrier carrying-in/out section 2002 transfers the carrier 2009, which is carried into the carrier stage 2010 from the outside, to the carrier stock 2012 or the carrier placing pedestal 2014 by using the carrier transfer mechanism 2011. Furthermore, the carrier carrying-in/out section 2002 transfers the carrier 2009 placed on the carrier placing pedestal 2014 to the carrier stock 2013 or the carrier stage 2010 by using the carrier transfer mechanism 2011. The carrier 2009 transferred to the carrier stage 2010 is carried out to the outside.

The lot forming section 2003 combines the wafers W accommodated in one or the plurality of carriers 2009 to form a lot consisting of the plurality of wafers W (for example, 50 wafers) that are simultaneously processed. When forming a lot, the lot may be formed so that the surfaces of the wafers W, on which patterns are formed, face each other, or may be formed so that all the surfaces of the wafers W, on which patterns are formed, face in one direction.

The lot forming section 2003 is provided with a substrate transfer mechanism 2015 configured to transfer the plurality of wafers W. The substrate transfer mechanism 2015 can change the posture of the wafers W during the transfer of the wafers W from a horizontal posture to a vertical posture or from a vertical posture to a horizontal posture.

The lot forming section 2003 transfers the wafers W to the lot placing section 2004 from the carrier 2009 placed on the carrier placing pedestal 2014 by using the substrate transfer mechanism 2015, and places the wafers W prepared to form the lot in the lot placing section 2004. Meanwhile, the lot forming section 2003 transfers a lot placed in the lot placing section 2004 to the carrier 2009 placed on the carrier placing pedestal 2014 by using the substrate transfer mechanism 2015. The substrate transfer mechanism 2015 has two kinds of substrate supporting units, as a substrate supporting unit that supports the plurality of wafers W, for example, a before-processing-substrate supporting unit that supports the before-processing wafers W (before being transferred by the lot transfer section 2005) and an after-processing-substrate supporting unit that supports the after-processing wafers W (after being transferred by the lot transfer section 2005). As a result, particles that have adhered to the before-processing wafers W are prevented from adhering to the after-processing wafers W.

The lot placing section 2004 temporarily places (waits for), on a lot placing pedestal 2016, a lot to be transferred by the lot transfer section 2005 between the lot forming section 2003 and the lot processing section 2006.

The lot placing section 2004 is provided with a carry-inside lot placing pedestal 2017 that places thereon a before-processing lot (before being transferred by the lot transfer section 2005) and a carry-out-side lot placing pedestal 2018 that places thereon an after-processing lot (after being transferred by the lot transfer section 2005). The plurality of wafers W corresponding to one lot are arranged back and forth in a vertical posture in the carry-in-side lot placing pedestal 2017 and the carry-out-side lot placing pedestal 2018.

Then, in the lot placing section 2004, a lot formed in the lot forming section 2003 is placed on the carry-in-side lot placing pedestal 2017, and the lot is carried into the lot processing section 2006 via the lot transfer section 2005. Meanwhile, in the lot placing section 2004, a lot carried out from the lot processing section 2006 via the lot transfer section 2005 is placed on the carry-out-side lot placing pedestal 2018, and the lot is transferred to the lot forming section 2003.

The lot transfer section 2005 transfers a lot between the lot placing section 2004 and the lot processing section 2006 or between processing units inside the lot processing section 2006.

The lot transfer section 2005 is provided with a lot transfer mechanism 2019 configured to transfer a lot. The lot transfer mechanism 2019 includes a rail 2020 that is arranged along an X-axis direction over the lot placing section 2004 and the lot processing section 2006 and a moving body 2021 that moves along the rail 2020 while holding the plurality of wafers W. The moving body 2021 is provided with a substrate holding body 2022, which holds the plurality of wafers W arranged back and forth in a vertical posture, in a freely movable manner.

Then, the lot transfer section 2005 receives the lot placed on the carry-in-side lot placing pedestal 2017 by using the substrate holding body 2022 of the lot transfer mechanism 2019, and delivers the lot to the lot processing section 2006. Meanwhile, the lot transfer section 2005 receives a lot processed in the lot processing section 2006 by using the substrate holding body 2022 of the lot transfer mechanism 2019, and delivers the lot to the carry-out-side lot placing pedestal 2018. Furthermore, the lot transfer section 2005 transfers a lot inside the lot processing section 2006 by using the lot transfer mechanism 2019.

The lot processing section 2006 performs processes such as etching, cleaning, and drying on the plurality of wafers W arranged back and forth in a vertical posture as one lot.

A processing unit 2023 that performs a drying process on the wafer W and a substrate-holding-body cleaning unit 2024 that performs a cleaning process on the substrate holding body 2022 are arranged in the lot processing section 2006. Furthermore, two processing units 2025, which perform a removing process for removing the boron monofilms 112 (see FIG. 1A) from the wafers W and a particle removing process for removing particles adhering to the removing-processed wafers W, are arranged in the lot processing section 2006. The processing unit 2023, the substrate-holding-body cleaning unit 2024, and the two processing units 2025 are arranged side by side along the rail 2020 of the lot transfer section 2005.

The processing unit 2023 includes a substrate lifting/lowering mechanism 2028 provided in a processing tank 2027 in a freely liftable manner. For example, IPA as processing liquid for drying is supplied to the processing tank 2027. The plurality of wafers W corresponding to one lot are held in the substrate lifting/lowering mechanism 2028 to be arranged back and forth in a vertical posture. The processing unit 2023 receives a lot from the substrate holding body 2022 of the lot transfer mechanism 2019 by using the substrate lifting/lowering mechanism 2028, and lifts and lowers the lot by using the substrate lifting/lowering mechanism 2028 so as to perform the drying process on the wafer W by using IPA supplied to the processing tank 2027. Meanwhile, the processing unit 2023 delivers the lot from the substrate lifting/lowering mechanism 2028 to the substrate holding body 2022 of the lot transfer mechanism 2019.

The substrate-holding-body cleaning unit 2024 is configured to supply processing liquid for cleaning and dry gas to a processing tank 2029. The substrate-holding-body cleaning unit 2024 supplies processing liquid for cleaning to the substrate holding body 2022 of the lot transfer mechanism 2019 and then supplies dry gas so as to perform the cleaning process on the substrate holding body 2022.

Each of the processing units 2025 includes a processing tank 2030 in which a removing process is performed and a processing tank 2031 in which a particle removing process is performed. Removal solution is retained in the processing tank 2030. Furthermore, SC1 or ammonium hydroxide (hereinafter, referred to as "rare ammonia water") diluted in a predetermined concentration, rinse liquid such as DIW, for example, are sequentially retained in the processing tank 2031. The processing tanks 2030 and 2031 are respectively provided with substrate lifting/lowering mechanisms 2032 and 2033 that are freely liftable.

Each of the substrate lifting/lowering mechanisms 2032 and 2033 holds the plurality of wafers W corresponding to one lot to be arranged back and forth in a vertical posture. The processing unit 2025 first receives the lot from the substrate holding body 2022 of the lot transfer mechanism 2019 by using the substrate lifting/lowering mechanism 2032 and lowers the lot by using the substrate lifting/lowering mechanism 2032 so as to immerse the lot in the removal solution retained in the processing tank 2030. As a result, the boron monofilms 112 are removed from the wafers W.

After that, the processing unit 2025 delivers the lot from the substrate lifting/lowering mechanism 2032 to the substrate holding body 2022 of the lot transfer mechanism 2019. Furthermore, in order to perform the rinsing process on the wafers W, the processing unit 2025 receives the lot from the substrate holding body 2022 of the lot transfer mechanism 2019 by using the substrate lifting/lowering mechanism 2033 and lowers the lot by using the substrate lifting/lowering mechanism 2033 so as to immerse the lot in DIW retained in the processing tank 2031. Next, the processing unit 2025 discharges the DIW from the processing tank 2031 and retains SC1 or rare ammonia water in the processing tank 2031 so as to immerse the lot in the SC1 or rare ammonia water. Next, in order to perform the rinsing process on the wafers W, the processing unit 2025 discharges the SC1 or rare ammonia water from the processing tank 2031 and again retains DIW in the processing tank 2031 so as to immerse the lot in the DIW. After that, the processing unit 2025 delivers the lot from the substrate lifting/lowering mechanism 2033 to the substrate holding body 2022 of the lot transfer mechanism 2019.

The controller 2007 controls operations of the components (the carrier carrying-in/out section 2002, the lot forming section 2003, the lot placing section 2004, the lot transfer section 2005, the lot processing section 2006, etc.) of the substrate processing apparatus 1H.

The controller 2007 is a computer, for example, and includes a computer-readable storage medium 2038. The storage medium 2038 stores therein a program for controlling various types of processes that are executed in the substrate processing apparatus 1H. The controller 2007 reads out and executes the program stored in the storage medium 2038 to control operations of the substrate processing apparatus 1H. Herein, a program may be stored in the storage medium 2038 that can be read by a computer, or may be installed into the storage medium 2038 of the controller 2007 from another storage medium. The computer-readable storage medium 2038 includes, for example, a hard disk (HD), a flexible disk (FD), a compact disc (CD), a magneto-optical disk (MO), a memory card, etc.

Figure 20:
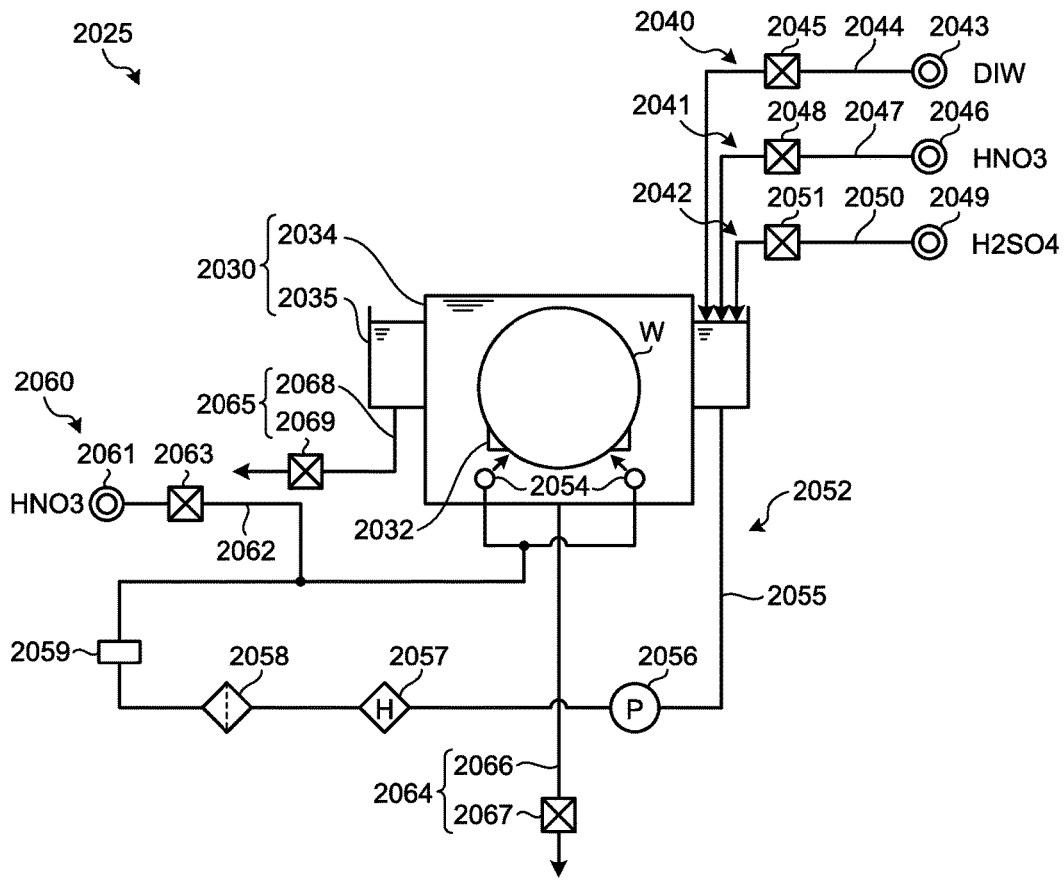
FIG. 20 is a diagram illustrating a configuration example of a removing-process performing processing tank and its periphery.

Next, a configuration example of the processing unit 2025 will be described. First, a configuration example of the removing-process performing processing tank 2030 and its periphery will be described with reference to FIG. 20. FIG. 20 is a diagram illustrating a configuration example of the removing-process performing processing tank 2030 and its periphery.

As illustrated in FIG. 20, the processing tank 2030 included in the processing unit 2025 includes an inner tank 2034 and an outer tank 2035 that is provided adjacent to the inner tank 2034 around the upper side of the inner tank 2034. The inner tank 2034 and the outer tank 2035 are configured to be together opened upward so that removal solution overflows from the upper portion of the inner tank 2034 toward the outer tank 2035.

The processing unit 2025 includes a DIW supply unit 2040 for supplying DIW to the processing tank 2030, a nitric acid supply unit 2041 for supplying a nitric acid to the processing tank 2030, and a sulfuric acid supply unit 2042 for supplying a sulfuric acid to the processing tank 2030.

The DIW supply unit 2040 includes a DIW supply source 2043, a DIW supply route 2044, and a valve 2045. By driving the valve 2045 from a closed state to an opened state, DIW is supplied from the DIW supply source 2043 to the outer tank 2035 of the processing tank 2030 via the DIW supply route 2044. The DIW supplied by the DIW supply unit 2040 is used in an abnormality handling process to be described later, which is executed in case of detecting the leakage of NOx. This point will be described below.

The nitric acid supply unit 2041 includes a nitric acid supply source 2046, a nitric acid supply route 2047, and a valve 2048. The nitric acid supply source 2046 is a tank that retains therein a nitric acid diluted with water (deionized water) in a predetermined concentration. For example, a nitric acid diluted in the concentration of 69% is retained in the nitric acid supply source 2046. By driving the valve 2048 from a closed state to an opened state, the diluted nitric acid is supplied from the nitric acid supply source 2046 to the outer tank 2035 of the processing tank 2030 via the nitric acid supply route 2047.

The sulfuric acid supply unit 2042 includes a sulfuric acid supply source 2049, a sulfuric acid supply route 2050, and a valve 2051. The sulfuric acid supply source 2049 is a tank that retains therein a sulfuric acid diluted with water (deionized water) in a predetermined concentration. For example, a sulfuric acid diluted in the concentration of 96% to 98% is retained in the sulfuric acid supply source 2049. By driving the valve 2051 from a closed state to an opened state, the diluted sulfuric acid is supplied from the sulfuric acid supply source 2049 to the outer tank 2035 of the processing tank 2030 via the sulfuric acid supply route 2050.

The nitric acid and sulfuric acid diluted in a predetermined concentration are supplied to the outer tank 2035, and thus the nitric acid and sulfuric acid are mixed within the outer tank 2035 to generate desired-concentration removal solution. As described above, the outer tank 2035 is equivalent to an example of a mixing unit that mixes a water-diluted sulfuric acid that circulates through the sulfuric acid supply route 2050 (example of strong acid supply route) and a water-diluted nitric acid that circulates through the nitric acid supply route 2047.

The processing unit 2025 further includes a circulation section 2052 that take outs removal solution retained in the processing tank 2030 from the processing tank 2030 and returns the removal solution to the processing tank 2030.

Specifically, the circulation section 2052 includes a nozzle 2054, a circulation channel 2055, a pump 2056, a heating unit 2057, a filter 2058, and a nitric-acid-concentration detecting unit 2059.

The nozzle 2054 is arranged inside the inner tank 2034 more downward than the wafers W held by the substrate lifting/lowering mechanism 2032 (see FIG. 19). The nozzle 2054 is a tube-shaped nozzle that extends in an array direction of the plurality of wafers W. The nozzle 2054 is configured to discharge removal solution from a plurality of discharge ports drilled in its circumferential surface toward the wafers W held by the substrate lifting/lowering mechanism 2032. As described above, the nozzle 2054 is equivalent to an example of a removal solution supply nozzle that supplies removal solution generated in the outer tank 2035 (example of mixing unit) onto the wafers W.

Both ends of the circulation channel 2055 are respectively connected to the bottom of the outer tank 2035 and the nozzle 2054. The pump 2056, the heating unit 2057, and the filter 2058 are provided within the circulation channel 2055 in this order. The circulation section 2052 circulates removal solution from the outer tank 2035 to the inner tank 2034 by driving the pump 2056. At that time, the removal solution is heated by the heating unit 2057 to a predetermined temperature and impurities are removed by the filter 2058.

The removal solution generated in the outer tank 2035 circulates through the circulation channel 2055 and is discharged from the nozzle 2054 into the inner tank 2034. As a result, the removal solution is retained in the inner tank 2034. Furthermore, the removal solution discharged into the inner tank 2034 overflows from the inner tank 2034 to the outer tank 2035, and again flows through the circulation channel 2055 from the outer tank 2035. As a result, the circulation flow of removal solution is formed.

The nitric-acid-concentration detecting unit 2059 is provided within the circulation channel 2055 to detect nitric-acid concentration of the removal solution flowing through the circulation channel 2055, and outputs the detection result to the controller 2007.

The processing unit 2025 further includes a concentration-regulating-liquid supply unit 2060. The concentration-regulating-liquid supply unit 2060 supplies a nitric acid that acts as concentration regulation liquid for regulating the concentration of removal solution. The concentration-regulating-liquid supply unit 2060 includes a nitric acid supply source 2061, a nitric acid supply route 2062, and a valve 2063. By driving the valve 2063 from a closed state to an opened state, a nitric acid is supplied from the nitric acid supply source 2061 into the circulation channel 2055 via the nitric acid supply route 2062. As described above, it is possible to earlier stabilize the concentration of removal solution by supplying concentration regulation liquid into the circulation channel 2055.

The processing unit 2025 further includes a first processing-liquid discharging unit 2064 configured to discharge removal solution from the inner tank 2034 and a second processing-liquid discharging unit 2065 configured to discharge removal solution from the outer tank 2035.

The first processing-liquid discharging unit 2064 includes a drain channel 2066 to connect the bottom of the inner tank 2034 to an external drain tube and a valve 2067 to open and close the drain channel 2066. The second processing-liquid discharging unit 2065 includes a drain channel 2068 to connect the bottom of the outer tank 2035 to an external drain tube and a valve 2069 to open and close the drain channel 2068.

The valves 2045, 2048, 2051, 2063, 2067, and 2069, the pump 2056, and the heating unit 2057 included in the processing unit 2025 are controlled by the controller 2007.

As described above, the substrate processing apparatus 1H according to the ninth embodiment immerses the wafers W in the removal solution retained in the processing tank 2030 to remove the boron monofilms 112 from the wafers W.

As described in the fourth embodiment, as compared with the case where the supply of removal solution onto the wafers W is continued (namely, the replacement of removal solution is continued), continuing to bring the same removal solution into contact with the wafers W can enhance removal efficiency of the boron monofilms 112. Therefore, as compared with the case where the replacement of removal solution on the wafers W is continued, the substrate processing apparatus 1H according to the ninth embodiment circulates removal solution by using the circulation section 2052 and simultaneously immerses the wafers W in removal solution retained in the processing tank 2030 so as to be able to enhance removal efficiency of the boron monofilms 112. Furthermore, it is possible to reduce a used amount of removal solution.

In addition, removal solution to be supplied onto the wafers W can be maintained to a constant temperature by heating the removal solution flowing through the circulation channel 2055 by using the heating unit 2057. As a result, it is possible to suppress the degradation of removal performance induced by temperature fall of removal solution.

In addition, the controller 2007 of the substrate processing apparatus 1H opens the valve 2063 of the concentration-regulating-liquid supply unit 2060 and supplies a nitric acid into the circulation channel 2055 when the concentration of removal solution detected by the nitric-acid-concentration detecting unit 2059 is less than a threshold value. As a result, it is possible to suppress the degradation of nitric-acid concentration caused by the volatilization of a nitric acid from removal solution.

Meanwhile, although the circulation channel 2055 is formed of, for example, piping such as fluorine resin having high corrosion resistance, there is a possibility that nitric-acid gas generated from removal solution goes through the piping to corrode members provided in the outside.

Therefore, the substrate processing apparatus 1H employs the circulation channel 2055 having a double-pipe structure and purges the inside of piping so as to suppress the leakage of nitric-acid gas to the outside of the circulation channel 2055.

Figure 21:
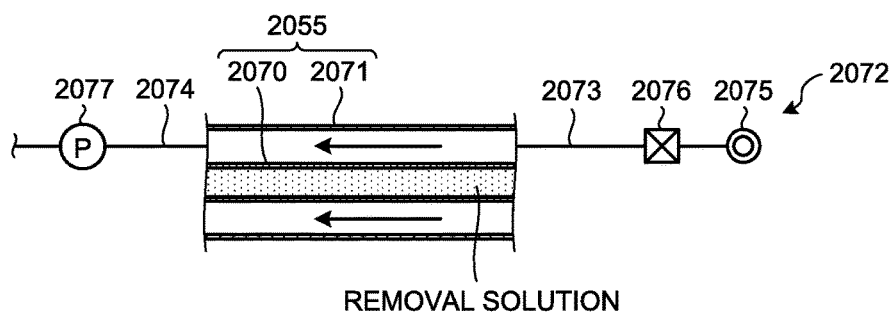
FIG. 21 is a diagram illustrating a configuration example of a circulation channel.

This point will be described with reference to FIG. 21. FIG. 21 is a diagram illustrating a configuration example of the circulation channel 2055.

As illustrated in FIG. 21, the circulation channel 2055 has a double-pipe structure, which includes an inside pipe 2070 arranged inside the circulation channel and an outside pipe 2071 arranged outside the inside pipe 2070. The inside pipe 2070 and the outside pipe 2071 are formed of, for example, a member such as fluorine resin having high corrosion resistance.

Both ends of the inside pipe 2070 are respectively connected to the bottom of the outer tank 2035 and the nozzle 2054 to circulate removal solution.

A purging unit 2072 is connected to the outside pipe 2071. The purging unit 2072 includes an upstream-side pipe 2073 connected to the upstream side of the outside pipe 2071 and a downstream-side pipe 2074 connected to the downstream side of the outside pipe 2071. The upstream-side pipe 2073 is provided with a fluid supply source 2075 that supplies fluid for purging to the upstream-side pipe 2073 and a valve 2076 that opens and closes the upstream-side pipe 2073. The downstream-side pipe 2074 is provided with a pump 2077. Fluid for purging may be gas such as air, or may be liquid such as water.

The purging unit 2072 supplies fluid for purging supplied from the fluid supply source 2075 to the outside pipe 2071 by way of the upstream-side pipe 2073. Furthermore, the purging unit 2072 discharges the fluid for purging supplied to the outside pipe 2071 to an external pipe by way of the downstream-side pipe 2074 by using the pump 2077. As a result, nitric-acid gas passing through the inside pipe 2070 is discharged to the external pipe along with fluid for purging. Therefore, nitric-acid gas generated from removal solution can be restrained from leaking to the outside of the circulation channel 2055.

Figure 22:
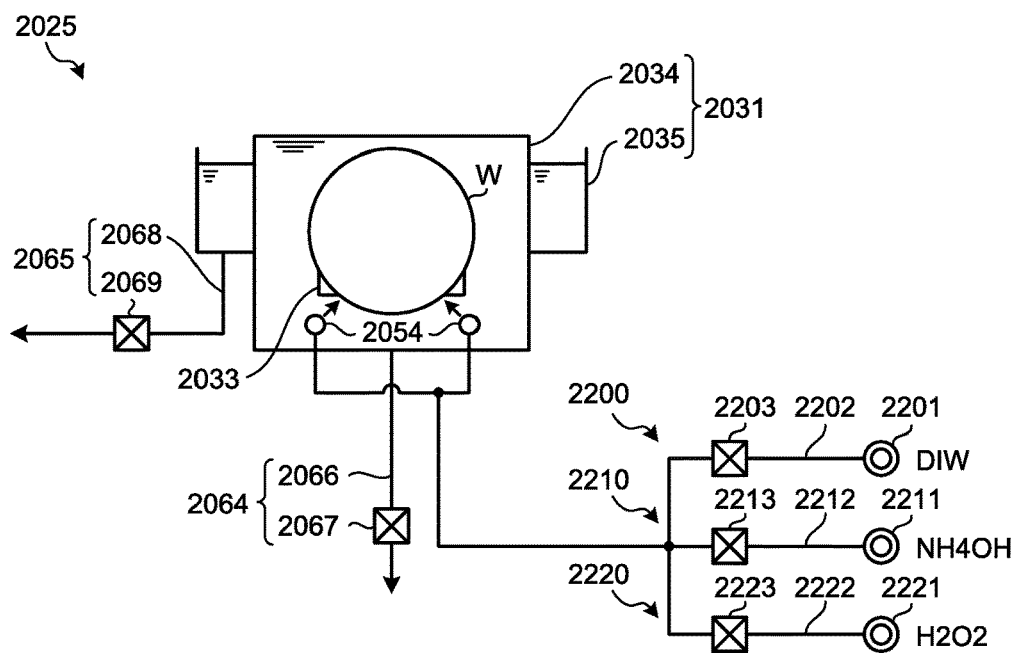
FIG. 22 is a diagram illustrating a configuration example of a particle-removing-process performing processing tank and its periphery.

Next, a configuration example of the particle-removing-process performing processing tank 2031 and its periphery will be described with reference to FIG. 22. FIG. 22 is a diagram illustrating a configuration example of the particle-removing-process performing processing tank 2031 and its periphery.

As illustrated in FIG. 22, similarly to the processing tank 2030, the processing tank 2031 included in the processing unit 2025 includes an inner tank 2034 and an outer tank 2035. A nozzle 2054 is provided inside the inner tank 2034. Furthermore, similarly to the processing tank 2030, the processing tank 2031 is provided with a first processing-liquid discharging unit 2064 and a second processing-liquid discharging unit 2065.

The processing tank 2031 is provided with a DIW supply unit 2200, an NH4OH supply unit 2210, and an H2O2 supply unit 2220. The DIW supply unit 2200 includes a DIW supply source 2201, a DIW supply route 2202 that circulates DIW supplied from the DIW supply source 2201, and a valve 2203 that opens and closes the DIW supply route 2202. The DIW supply unit 2200 supplies DIW supplied from the DIW supply source 2201 to the nozzle 2054 via the DIW supply route 2202.

The NH4OH supply unit 2210 includes an NH4OH supply source 2211, an NH4OH supply route 2212 that circulates NH4OH supplied from the NH4OH supply source 2211, and a valve 2213 that opens and closes the NH4OH supply route 2212. The NH4OH supply unit 2210 supplies NH4OH supplied from the NH4OH supply source 2211 to the nozzle 2054 via the NH4OH supply route 2212.

The H2O2 supply unit 2220 includes an H2O2 supply source 2221, an H2O2 supply route 2222 that circulates H2O2 supplied from the H2O2 supply source 2221, and a valve 2223 that opens and closes the H2O2 supply route 2222. The H2O2 supply unit 2220 supplies H2O2 supplied from the H2O2 supply source 2221 to the nozzle 2054 via the H2O2 supply route 2222.

When supplying DIW that acts as rinse liquid, the valve 2203 is opened in a state where the valves 2213 and 2223 are closed. As a result, DIW is supplied from the nozzle 2054 to the inner tank 2034.

On the other hand, when supplying rare ammonia water that acts as removal solution for particles, the valves 2203 and 2213 are opened in a state where the valve 2223 is closed. As a result, DIW supplied from the DIW supply source 2201 and NH4OH supplied from the NH4OH supply source 2211 are mixed, and thus rare ammonia water is supplied from the nozzle 2054 to the inner tank 2034. The DIW supply route 2202 and the NH4OH supply route 2212 are provided with flow regulating mechanisms that are not illustrated. The flow regulating mechanisms regulate flow volumes of DIW and NH4OH to mix DIW and NH4OH at a desired ratio.

Meanwhile, when supplying SC1 that acts as removal solution for particles, the valves 2203, 2213, and 2223 are opened. As a result, DIW supplied from the DIW supply source 2201, NH4OH supplied from the NH4OH supply source 2211, and H2O2 supplied from the H2O2 supply source 2221 are mixed, and thus SC1 is supplied from the nozzle 2054 to the inner tank 2034. The DIW supply route 2202, the NH4OH supply route 2212, and the H2O2 supply route 2222 are provided with flow regulating mechanisms that are not illustrated. The flow regulating mechanisms regulate flow volumes of DIW, NH4OH, and H2O2 to mix DIW, NH4OH, and H2O2 at a desired ratio.

The valves 2067, 2069, 2203, 2213, and 2223 and the flow regulating mechanisms (not illustrated) are controlled to be opened or closed by the controller 2007.

A point-of-use-based (POU-based) process for sequentially supplying and draining DIW acting as rinse liquid and rare ammonia water or SC1 acting as removal solution for particles to perform a plurality of processes on the wafers W in a single tank is performed in the processing tank 2031. This point will be described below.

Figure 23:
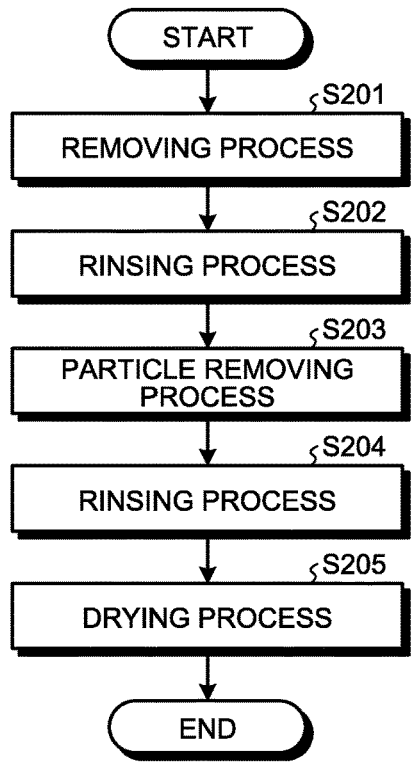
FIG. 23 is a flowchart illustrating an example of the procedure of substrate processing that is executed by the substrate processing apparatus according to the ninth embodiment.

Next, an example of the specific operations of the substrate processing apparatus 1H will be described with reference to FIG. 23. FIG. 23 is a flowchart illustrating an example of the procedure of substrate processing that is executed by the substrate processing apparatus 1H according to the ninth embodiment. Each process illustrated in FIG. 23 is performed in accordance with the control of the controller 2007. Furthermore, the processes illustrated in FIG. 23 are performed after the film forming process of Step S101 and the etching process of Step S102 as illustrated in FIG. 8 are performed.

As illustrated in FIG. 23, in the substrate processing apparatus 1H, a removing process is performed on the etching-processed wafers W (Step S201).

In the removing process, the processing unit 2025 receives a lot from the substrate holding body 2022 of the lot transfer mechanism 2019 by using the substrate lifting/lowering mechanism 2032 and lowers the lot by using the substrate lifting/lowering mechanism 2032 so as to immerse the lot in removal solution retained in the processing tank 2030. As a result, the boron monofilms 112 are removed from the wafers W.

After that, the processing unit 2025 takes out the lot from the processing tank 2030 by using the substrate lifting/lowering mechanism 2032, and then delivers the taken lot to the substrate holding body 2022 of the lot transfer mechanism 2019.

Next, a rinsing process is performed in the substrate processing apparatus 1H (Step S202). In the rinsing process, the processing unit 2025 receives the lot from the substrate holding body 2022 of the lot transfer mechanism 2019 by using the substrate lifting/lowering mechanism 2033 and lowers the lot by using the substrate lifting/lowering mechanism 2033 to immerse the lot in DIW retained in the processing tank 2031. As a result, removal solution is removed from the wafers W.

DIW that overflows from the inner tank 2034 to the outer tank 2035 is discharged from the second processing-liquid discharging unit 2065 to an external drain tube. Therefore, fresh DIW is always supplied onto the plurality of wafers W.

After that, the processing unit 2025 closes the valve 2203 of the DIW supply unit 2200 and opens the valve 2067 of the first processing-liquid discharging unit 2064 for a predetermined time to discharge DIW from the processing tank 2031.

Next, a particle removing process is performed in the substrate processing apparatus 1H (Step S203). In the particle removing process, the processing unit 2025 opens, for example, the valve 2203 of the DIW supply unit 2200, the valve 2213 of the NH4OH supply unit 2210, and the valve 2223 of the H2O2 supply unit 2220, and retains SC1 in the inner tank 2034 of the processing tank 2031 to immerse the lot located in the inner tank 2034 in the SC1. As a result, particles are removed from the wafers W. The SC1 that overflows from the inner tank 2034 to the outer tank 2035 is discharged from the second processing-liquid discharging unit 2065 to the external drain tube. Therefore, fresh SC1 is always supplied onto the plurality of wafers W.

The processing unit 2025 may further include an ultrasonic vibration unit that applies ultrasonic vibration to the inner tank 2034. In this case, in the particle removing process, the processing unit 2025 applies ultrasonic vibration to the inner tank 2034 by using the ultrasonic vibration unit. As a result, because physical force caused by ultrasonic vibration is applied to the wafers W in addition to a chemical action (etching action) of the SC1, it is possible to enhance removal efficiency of particles.

After that, the processing unit 2025 closes the valves 2203, 2213, and 2223 and opens the valve 2067 of the first processing-liquid discharging unit 2064 for a predetermined time to discharge SC1 from the processing tank 2031.

In addition, in the particle removing process, rare ammonia water may be retained in the inner tank 2034 by opening the valve 2203 of the DIW supply unit 2200 and the valve 2213 of the NH4OH supply unit 2210.

Next, a rinsing process is performed in the substrate processing apparatus 1H (Step S204). In the rinsing process, the processing unit 2025 opens the valve 2203 of the DIW supply unit 2200 and retains DIW in the inner tank 2034 of the processing tank 2031 to immerse the lot located in the inner tank 2034 in the DIW. As a result, SC1 is removed from the wafers W.

After that, the processing unit 2025 delivers the lot from the substrate lifting/lowering mechanism 2033 to the substrate holding body 2022 of the lot transfer mechanism 2019.

Next, a drying process is performed in the substrate processing apparatus 1H (Step S205). In the drying process, the processing unit 2023 receives the lot from the substrate holding body 2022 of the lot transfer mechanism 2019 by using the substrate lifting/lowering mechanism 2028 and lowers the lot by using the substrate lifting/lowering mechanism 2028 so as to immerse the lot in IPA retained in the processing tank 2027. As a result, DIW is removed from the wafers W. After that, the processing unit 2023 lifts the lot by using the substrate lifting/lowering mechanism 2028. As a result, IPA remaining on the wafers W is volatilized so as to dry the wafers W.

After that, the processing unit 2023 delivers the lot from the substrate lifting/lowering mechanism 2028 to the substrate holding body 2022 of the lot transfer mechanism 2019, and the lot transfer mechanism 2019 places the lot on the lot placing section 2004. After that, the lot forming section 2003 transfers the lot placed in the lot placing section 2004 to the carrier 2009 placed on the carrier placing pedestal 2014 by using the substrate transfer mechanism 2015. Then, the carrier carrying-in/out section 2002 transfers the carrier 2009 placed on the carrier placing pedestal 2014 to the carrier stage 2010 by using the carrier transfer mechanism 2011. As a result, substrate processing consisting of the series of processes performed in the substrate processing apparatus 1H is terminated. Then, the carrier 2009 transferred to the carrier stage 2010 is carried out to the outside.

Figure 24:
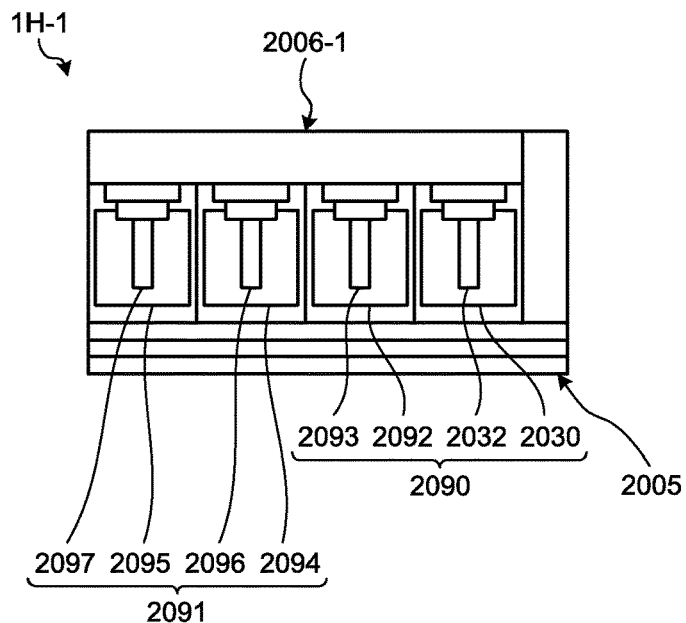
FIG. 24 is a diagram illustrating a configuration example of a substrate processing apparatus according to an alternative example of the ninth embodiment.
Figure 25:
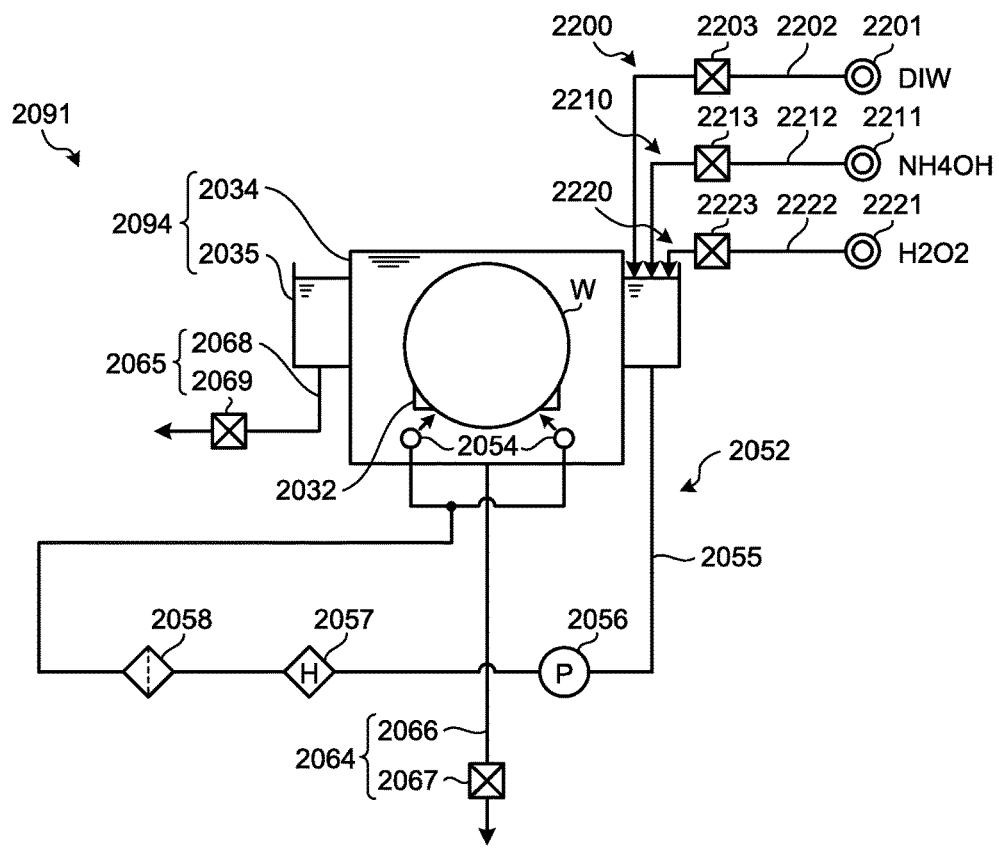
FIG. 25 is a diagram illustrating a configuration example of a particle-removing-process performing processing tank and its periphery in a processing unit according to the alternative example.

Next, an alternative example of the substrate processing apparatus 1H described above will be described with reference to FIG. 24. FIG. 24 is a diagram illustrating a configuration example of a substrate processing apparatus 1H-1 according to an alternative example of the ninth embodiment. FIG. 25 is a diagram illustrating a configuration example of a particle-removing-process performing processing tank and its periphery in a processing unit 2091 according to the alternative example. Herein, a part of the lot processing section is not illustrated in FIG. 24. The components other than the lot processing section are similar to those of the substrate processing apparatus 1H.

As illustrated in FIG. 24, the substrate processing apparatus 1H-1 according to the alternative example includes a lot processing section 2006-1.

The lot processing section 2006-1 includes a processing unit 2090 that performs a removing process and a subsequent rinsing process and the processing unit 2091 that performs a particle removing process and a subsequent rinsing process.

The processing unit 2090 includes the processing tank 2030 in which a removing process is performed and a processing tank 2092 in which a rinsing process is performed. Similarly to the processing tanks 2030 and 2031, the processing tank 2092 includes the inner tank 2034 and the outer tank 2035. The peripheral configuration of the processing tank 2092 is similar to the configuration obtained by removing the NH4OH supply unit 2210 and the H2O2 supply unit 2220 from the configuration illustrated in FIG. 22. The processing tank 2092 is provided with a substrate lifting/lowering mechanism 2093 that is freely liftable.

The processing unit 2091 includes a processing tank 2094 in which a particle removing process is performed and a processing tank 2095 in which a rinsing process is performed.

As illustrated in FIG. 25, the processing tank 2094 includes the inner tank 2034 and the outer tank 2035. The inner tank 2034 is provided with the nozzle 2054 and the first processing-liquid discharging unit 2064, and the outer tank 2035 is provided with the second processing-liquid discharging unit 2065.

The processing unit 2091 includes the DIW supply unit 2200, the NH4OH supply unit 2210, and the H2O2 supply unit 2220. The DIW supply unit 2200, the NH4OH supply unit 2210, and the H2O2 supply unit 2220 respectively supplies DIW, NH4OH, and H2O2 to the outer tank 2035. The DIW and NH4OH are mixed within the outer tank 2035 by supplying the DIW and NH4OH to the outer tank 2035, and thus rare ammonia water is generated. Furthermore, the DIW, NH4OH, and H2O2 are mixed within the outer tank 2035 by supplying the DIW, NH4OH, and H2O2 to the outer tank 2035, and thus SC1 is generated.

The processing unit 2091 further includes the circulation section 2052. The circulation channel 2055 of the circulation section 2052 is provided with the pump 2056, the heating unit 2057, and the filter 2058. The circulation section 2052 circulates SC1 or rare ammonia water from the outer tank 2035 to the processing tank 2094 by driving the pump 2056. At that time, SC1 or rare ammonia water is heated by the heating unit 2057 to a predetermined temperature and impurities are removed by the filter 2058.

The configuration of the processing tank 2095 and its periphery is similar to the configuration of the processing tank 2092 and its periphery described above. The processing tanks 2094 and 2095 are respectively provided with substrate lifting/lowering mechanisms 2096 and 2097 that are freely liftable.

In the substrate processing apparatus 1H-1 configured as described above, the removing process (Step S201), the rinsing process (Step S202), the particle removing process (Step S203), and the rinsing process (Step S204) described above are respectively performed in the processing tanks 2030, 2092, 2094, and 2095. As a result, because a process for discharging DIW to retain SC1 or rare ammonia water and a process for discharging SC1 or rare ammonia water to retain DIW as in the substrate processing apparatus 1 becomes unnecessary, it is possible to reduce a time used for the processes.

In addition, because the substrate processing apparatus 1H-1 according to the alternative example circulates SC1 or rare ammonia water to be used for the particle removing process (Step S203) and reuses the circulated SC1 or rare ammonia water, it is possible to suppress an used amount of SC1 or rare ammonia water.

Figure 26:
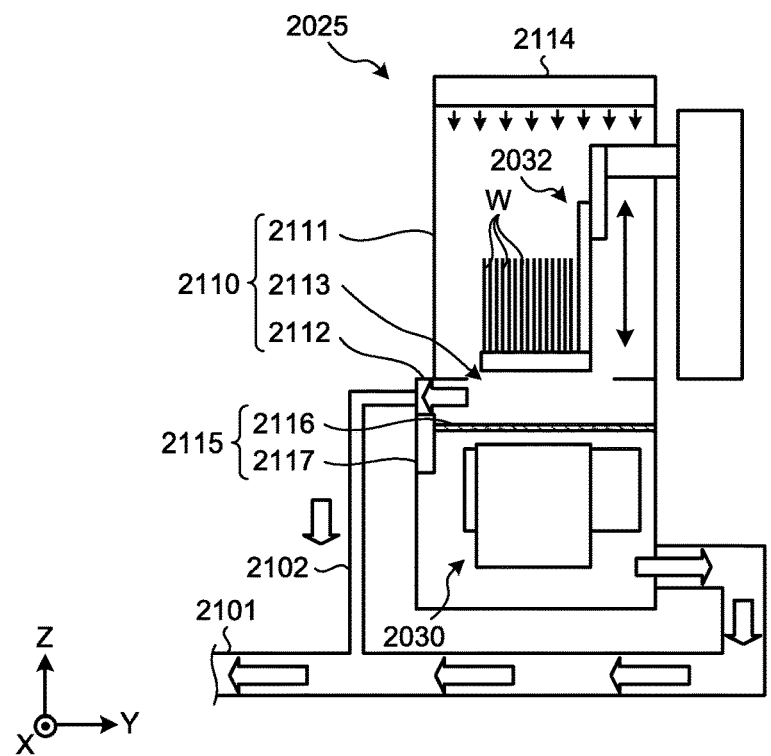
FIG. 26 is a diagram illustrating a configuration example of an exhaust path of the processing unit.
Figure 27:
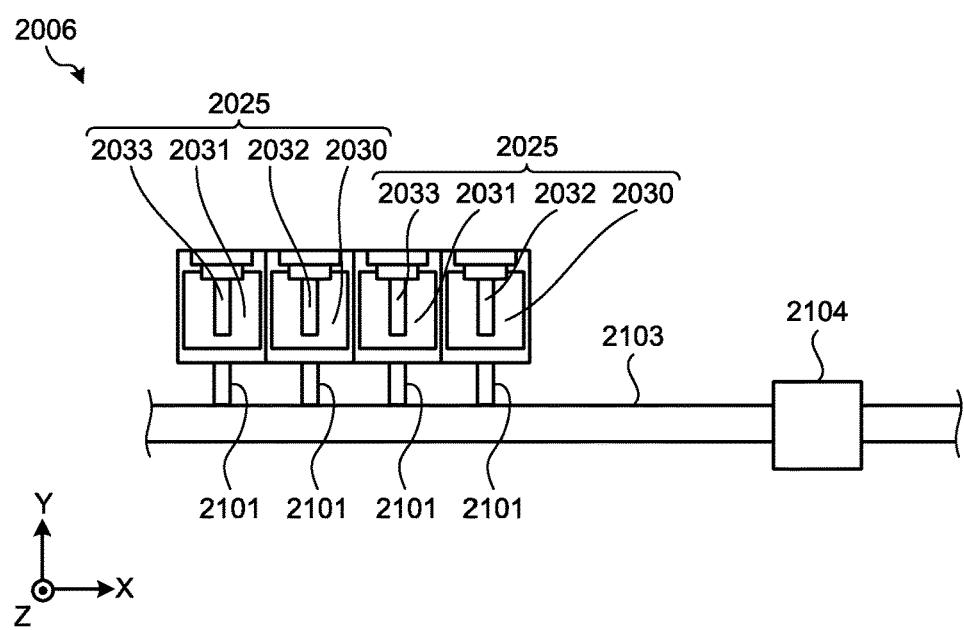
FIG. 27 is a diagram illustrating a configuration example of an exhaust path of a lot processing section.

Next, the configuration of an exhaust path in the processing unit 2025 and the lot processing section 2006 will be described with reference to FIGS. 26 and 27. FIGS. 26 and 27 are diagrams illustrating a configuration example of an exhaust path in the processing unit 2025 and the lot processing section 2006. Herein, although a configuration example of an exhaust path in the lot processing section 2006 will be described, the exhaust path is similar to that of the lot processing section 2006-1 according to the alternative example.

As illustrated in FIG. 26, the processing unit 2025 includes a chamber 2110. The chamber 2110 includes a first accommodating section 2111 configured to accommodate the substrate lifting/lowering mechanism 2032 and a second accommodating section 2112 configured to accommodate the processing tank 2030. The first and second accommodating sections 2111 and 2112 communicate with each other via an opening 2113.

An FFU 2114 is provided on a ceiling of the first accommodating section 2111. The FFU 2114 forms a downflow within the chamber 2110.

The second accommodating section 2112 is provided with an opening/closing unit 2115 between the opening 2113 and the processing tank 2030. The opening/closing unit 2115 is arranged within the chamber 2110 more upward than the processing tank 2030. The opening/closing unit 2115 includes an openable/closable cover body 2116 that vertically partitions the inside of the chamber 2110 and a driving unit 2117 that drives the cover body 2116. By closing the cover body 2116 by using the driving unit 2117, a space that substantially seals up the processing tank 2030 below the cover body 2116 is formed in the second accommodating section 2112.

The processing unit 2025 includes an exhaust pipe 2101 (example of first exhaust pipe) configured to exhaust a space located below the cover body 2116 within the chamber 2110 and an exhaust pipe 2102 (example of second exhaust pipe) configured to exhaust a space located above the cover body 2116 within the chamber 2110. One end of the exhaust pipe 2101 is connected to the second accommodating section 2112 below the cover body 2116, and the other end is connected to a collection pipe 2103 illustrated in FIG. 27.

One end of the exhaust pipe 2102 is connected to the second accommodating section 2112 above the cover body 2116, and the other end is connected to the exhaust pipe 2101.

As described above, the processing unit 2025 includes the exhaust pipe 2101, which exhausts a space located below the cover body 2116 within the second accommodating section 2112, namely, an arrangement space of the processing tank 2030 in which removal solution is retained, and the exhaust pipe 2102 that exhausts a space located above the cover body 2116 within the second accommodating section 2112. As a result, even if NOx generated from removal solution leaks out to the space located above the cover body 2116, the exhaust pipe 2102 can exhaust the NOx. Therefore, as compared with a case where the processing unit does not include the exhaust pipe 2102, the collection pipe 2103 can more surely collect NOx generated from removal solution. Herein, NOx (nitrogen oxide) is a generic name of an oxide of nitrogen, and is, for example, nitrogen monoxide, nitrogen dioxide, nitrous oxide, nitrogen trioxide, etc.

It is preferable that the exhaust pipe 2102 is arranged near the cover body 2116. It is possible to efficiently exhaust NOx leaked from the cover body 2116 by arranging the exhaust pipe 2102 near the cover body 2116.

As illustrated in FIG. 27, the lot processing section 2006 includes a plurality of the exhaust pipes 2101 (herein, four exhaust pipes) corresponding to the processing tanks 2030 and 2031 of the two processing units 2025. Incidentally, because removal solution is not retained in the processing tank 2031, the exhaust pipe 2101 corresponding to the processing tank 2031 does not necessarily need the exhaust pipe 2102.

Figure 28:
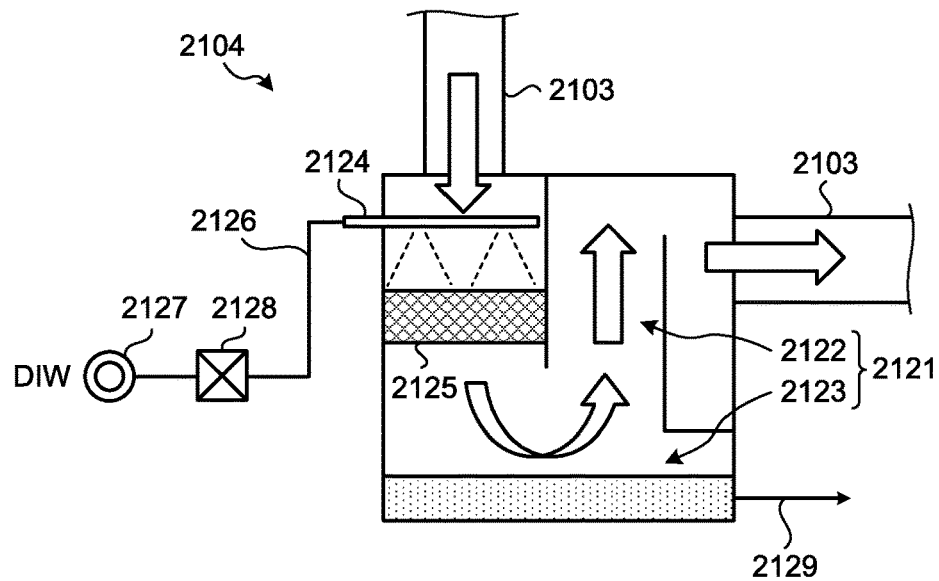
FIG. 28 is a diagram illustrating a configuration example of a scrubber.

Each of the exhaust pipes 2101 is connected to the collection pipe 2103. The collection pipe 2103 is provided with a scrubber 2104 that removes NOx from exhaust gas flowing through the collection pipe 2103. Herein, a configuration example of the scrubber 2104 will be described with reference to FIG. 28. FIG. 28 is a diagram illustrating a configuration example of the scrubber 2104.

As illustrated in FIG. 28, the scrubber 2104 includes a housing 2121. A flow channel 2122 is provided in an upper portion of the housing 2121, and a retaining unit 2123 of liquid is provided in a lower portion of the housing 2121.

A spray nozzle 2124 and a demister 2125 are provided in the flow channel 2122. The spray nozzle 2124 is connected to a DIW supply route 2126. A DIW supply source 2127 and a valve 2128 to open and close the DIW supply route 2126 are provided in the DIW supply route 2126. DIW supplied from the DIW supply source 2127 is sprayed from the spray nozzle 2124 to the flow channel 2122 via the DIW supply route 2126. The demister 2125 is provided below the spray nozzle 2124 to remove mist from exhaust gas. The mist removed from exhaust gas falls downward and is retained in the retaining unit 2123. A drain pipe 2129 is connected to the retaining unit 2123 to discharge liquid retained in the retaining unit 2123 from the drain pipe 2129 to the outside.

The scrubber 2104 configured as described above brings exhaust gas flowing into the flow channel 2122 from the upstream-side collection pipe 2103 into contact with DIW sprayed from the spray nozzle 2124 so as to remove NOx, and passes through the demister 2125 so as to remove moisture. Then, exhaust gas obtained by removing NOx and moisture flows out from the flow channel 2122 to the downstream-side collection pipe 2103.

As described above, because the scrubber 2104 is provided in the collection pipe 2103, it is possible to remove NOx from exhaust gas circulating through the collection pipe 2103.

Figure 29:
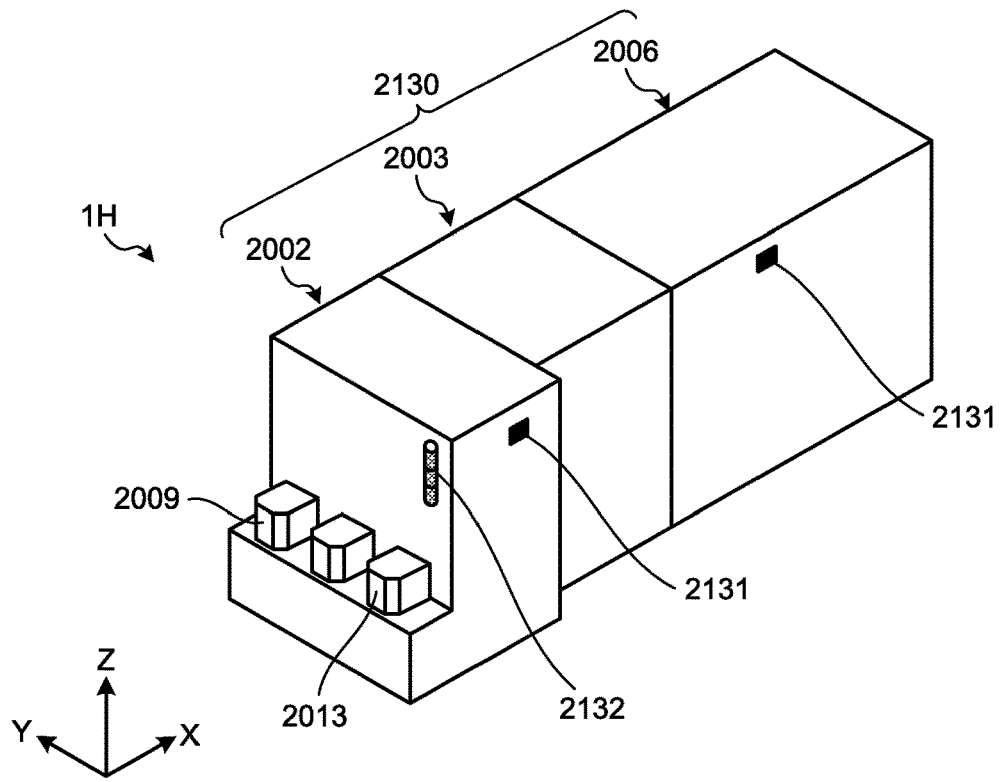
FIG. 29 is a diagram illustrating an exterior configuration example of the substrate processing apparatus.
Figure 30:
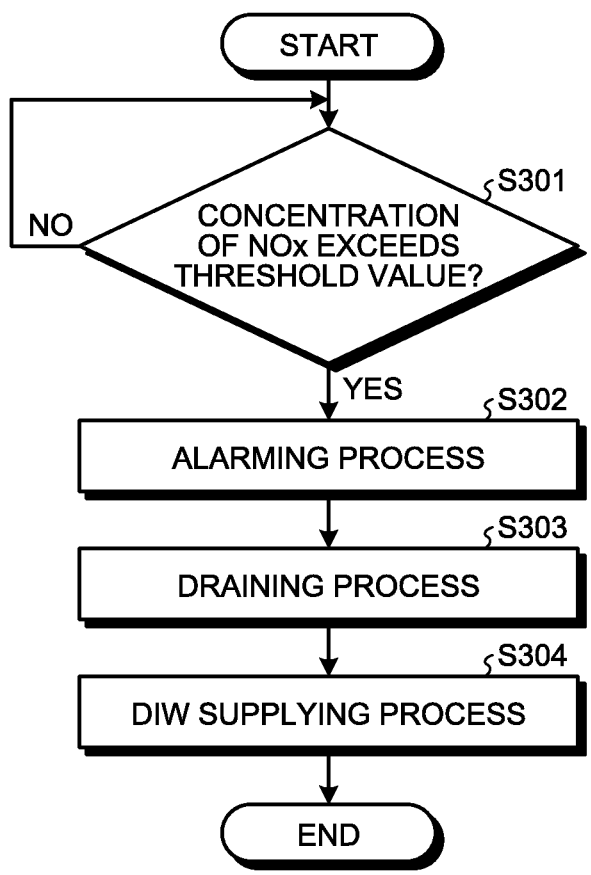
FIG. 30 is a flowchart illustrating an example of a processing procedure of an abnormality handling process.

Next, handling when NOx temporarily flows out of the substrate processing apparatus 1H will be described with reference to FIGS. 29 and 30. FIG. 29 is a diagram illustrating an exterior configuration example of the substrate processing apparatus 1H. FIG. 30 is a flowchart illustrating an example of a processing procedure of an abnormality handling process. Herein, although the abnormality handling process will be described by using the substrate processing apparatus 1H as an example, the abnormality handling process can be similarly applied to the substrate processing apparatus 1H-1 according to the alternative example.

As illustrated in FIG. 29, the substrate processing apparatus 1H includes a housing 2130 that accommodates the carrier transfer mechanism 2011 of the carrier carrying-in/out section 2002, the substrate transfer mechanism 2015 of the lot forming section 2003, the processing units 2025 of the lot processing section 2006, and the like, as described above. A plurality of NOx detecting units 2131 (herein, two NOx detecting units) and an indicating lamp 2132 are provided on the outer surface of the housing 2130. The NOx detecting units 2131 detect the concentration of NOx outside the housing 2130, and output the detection results to the controller 2007. The indicating lamp 2132 is, for example, a light emitting diode (LED) lamp.

As illustrated in FIG. 30, the controller 2007 of the substrate processing apparatus 1H determines whether the concentration of NOx detected by the NOx detecting unit 2131 exceeds a threshold value (Step S301). When the concentration of NOx detected by the NOx detecting unit 2131 does not exceed the threshold value (Step S301: No), the controller 2007 repeats the process of Step S301 until the concentration of NOx exceeds the threshold value.

On the other hand, at Step S301, when it is determined that the concentration of NOx detected by the NOx detecting unit 2131 exceeds the threshold value (Step S301: Yes), the controller 2007 performs an alarming process (Step S302). In the alarming process, the controller 2007 turns on the indicating lamp 2132, for example. Alternatively, the controller 2007 may output warning sound from a speaker (not illustrated) included in the substrate processing apparatus 1H. As a result, the controller can notify an operator etc. of the leakage of NOx.

Next, the controller 2007 performs a draining process (Step S303). In the draining process, the controller 2007 opens the valve 2067 of the first processing-liquid discharging unit 2064 for a predetermined time so as to discharge removal solution retained in the processing tank 2030. Next, the controller 2007 performs a DIW supplying process (Step S304). In the DIW supplying process, the controller 2007 closes the valve 2048 of the nitric acid supply unit 2041 and the valve 2051 of the sulfuric acid supply unit 2042 and opens the valve 2045 of the DIW supply unit 2040 for a predetermined time so as to retain DIW in the processing tank 2030. In this way, it is possible to suppress the further generation of NOx by discharging removal solution from the processing tank 2030 to replace it with DIW.

As described above, each of the processing units 2025 and 2090 of the substrate processing apparatuses 1H and 1H-1 according to the ninth embodiment includes the processing tank 2030 that retains therein removal solution and the substrate lifting/lowering mechanism 2032 that is arranged above the processing tank 2030 to lift and lower the wafers W. Herein, the controllers 2007 of the substrate processing apparatuses 1H and 1H-1 are configured to make the processing tank 2030 retain therein removal solution and then make the substrate lifting/lowering mechanism 2032 immerse the wafers W in the removal solution retained in the processing tank 2030.

Therefore, according to the substrate processing apparatuses 1H and 1H-1 according to the ninth embodiment, it is possible to enhance removal efficiency of the boron monofilms 112 compared with the case where the replacement of removal solution is continued. Furthermore, it is possible to reduce a used amount of removal solution.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A substrate processing method comprising:
   bringing removal solution obtained by mixing a nitric acid, a strong acid stronger than the nitric acid, and water into contact with a substrate in which a boron monofilm is formed on a film including a silicon-based film so as to remove the boron monofilm from the substrate, wherein the boron monofilm consists of only boron and inevitable impurities.

2. The substrate processing method according to claim 1, wherein
   the bringing includes, before supplying the removal solution onto the substrate, mixing the strong acid diluted with water and the nitric acid diluted with water in a state where flow speeds for supplying the acids onto the substrate are maintained to generate the removal solution.

3. The substrate processing method according to claim 1, wherein
   the bringing includes mixing the strong acid diluted with water and the nitric acid diluted with water on the substrate to generate the removal solution.

4. The substrate processing method according to claim 1, wherein
   the brining includes forming a solution film of the removal solution on the substrate and then maintaining a state where the solution film of the removal solution is formed on the substrate for a predetermined time.

5. The substrate processing method according to claim 4, wherein
   the maintaining includes making the removal solution stay on the substrate for the predetermined time after forming the solution film.

6. The substrate processing method according to claim 1, wherein
   the bringing includes forming a solution film of the removal solution on the substrate and then heating the removal solution in a state where a cover body whose flat surface faces the substrate is brought into contact with the solution film.

7. The substrate processing method according to claim 1, wherein
   the brining includes:
   storing the removal solution in a dish-shaped placing unit that has an inner circumferential surface whose diameter is gradually reduced downward to contact with a bevel face of the substrate on the inner circumferential surface; and
   heating the removal solution in a state where the substrate is brought into contact with the removal solution stored in the placing unit by placing the substrate in the placing unit.

8. The substrate processing method according to claim 1, wherein
   the bringing includes:
   retaining the removal solution in a processing tank; and
   immersing the substrate in the removal solution retained in the processing tank.

9. The substrate processing method according to claim 1, further comprising:
   forming the boron monofilm on the substrate that includes a film including the silicon-based film;
   bringing the removal solution into contact with a reverse face and a bevel face of the substrate on which the boron monofilm is formed so as to remove the boron monofilm from the reverse face and bevel face of the substrate; and
   etching a top face of the substrate from which the boron monofilm is removed, wherein
   the bringing is performed on the substrate on which the etching is performed.

10. The substrate processing method according to claim 1, wherein
    the strong acid in the removal solution is a sulfuric acid,
    a concentration of the sulfuric acid is not more than 64 wt %, and
    a concentration of the nitric acid in the removal solution is not less than 3 wt % and not more than 69 wt %.

11. The substrate processing method according to claim 1, wherein
    the strong acid in the removal solution is a sulfuric acid,
    a concentration of the sulfuric acid is not more than 50 wt %, and
    a concentration of the nitric acid in the removal solution is not less than 3 wt % and not more than 69 wt %.

* * * * *